United States Patent
Hwang et al.

(10) Patent No.: US 11,206,044 B2
(45) Date of Patent: Dec. 21, 2021

(54) METHOD AND TERMINAL FOR CHANNEL ENCODING USING POLAR CODE

(71) Applicant: LG ELECTRONICS INC., Seoul (KR)

(72) Inventors: Seunggye Hwang, Seoul (KR); Bonghoe Kim, Seoul (KR); Joonkui Ahn, Seoul (KR); Kijun Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 160 days.

(21) Appl. No.: 16/065,753

(22) PCT Filed: Jan. 3, 2018

(86) PCT No.: PCT/KR2018/000084
§ 371 (c)(1),
(2) Date: Dec. 20, 2018

(87) PCT Pub. No.: WO2018/128367
PCT Pub. Date: Jul. 12, 2018

(65) Prior Publication Data
US 2019/0319641 A1    Oct. 17, 2019

Related U.S. Application Data

(60) Provisional application No. 62/442,959, filed on Jan. 5, 2017.

(51) Int. Cl.
H04B 7/02 (2018.01)
H03M 13/13 (2006.01)
(Continued)

(52) U.S. Cl.
CPC ....... *H03M 13/13* (2013.01); *H03M 13/2789* (2013.01); *H03M 13/2903* (2013.01);
(Continued)

(58) Field of Classification Search
CPC ............ H03M 13/13; H03M 13/2789; H03M 13/2903; H03M 13/27; H03M 13/635; H04W 72/02; H04W 72/0413; H04W 72/042; H04W 88/02; H04L 1/0072; H04L 1/0067; H04L 1/0071; H04L 1/0057; H04L 1/0041
(Continued)

(56) References Cited

U.S. PATENT DOCUMENTS

2016/0079999 A1    3/2016 Shen et al.
2016/0218743 A1    7/2016 Li et al.
(Continued)

OTHER PUBLICATIONS

Ericsson, "Channel Coding Candidates for Control Channel". R1-1611326, 3GPP TSG RAN WGI Meeting #87, Reno, USA, Nov. 6, 2016, See sections 1-2.2.
(Continued)

*Primary Examiner* — Don N Vo
(74) *Attorney, Agent, or Firm* — Fish & Richardson P.C.

(57) ABSTRACT

Disclosed in the present specification is a method for performing channel encoding. The method can comprise the steps of: interleaving information bits; and encoding the interleaved information bits by using a polar code. The information bits can be interleaved according to an interleaving pattern.

7 Claims, 25 Drawing Sheets

(51) Int. Cl.
*H03M 13/27* (2006.01)
*H03M 13/29* (2006.01)
*H04W 72/02* (2009.01)
*H04W 72/04* (2009.01)
*H04W 88/02* (2009.01)

(52) U.S. Cl.
CPC ......... *H04W 72/02* (2013.01); *H04W 72/042* (2013.01); *H04W 72/0413* (2013.01); *H04W 88/02* (2013.01)

(58) Field of Classification Search
USPC .............................................. 375/240.2, 267
See application file for complete search history.

(56) References Cited

U.S. PATENT DOCUMENTS

| 2016/0269050 | A1 | 9/2016 | Shen et al. | |
| 2017/0288703 | A1* | 10/2017 | Shen | H03M 13/275 |
| 2017/0366377 | A1* | 12/2017 | Papasakellariou | H04L 27/261 |
| 2018/0331807 | A1* | 11/2018 | Kim | H04L 29/06 |
| 2019/0342768 | A1* | 11/2019 | Xu | H04B 7/0639 |
| 2020/0008228 | A1* | 1/2020 | Lee | H04W 72/1284 |

OTHER PUBLICATIONS

InterDigital Communications. "Interleaver for Polar Codes," R1-1612656, 3GPP TSG RAN WG1 Meeting #87, Reno. USA, Nov. 5, See section 2.
International Search Report and Written Opinion in International Application No. PCT/KR2018/000084, dated Apr. 9, 2018, 11 pages.

* cited by examiner

FIG. 7

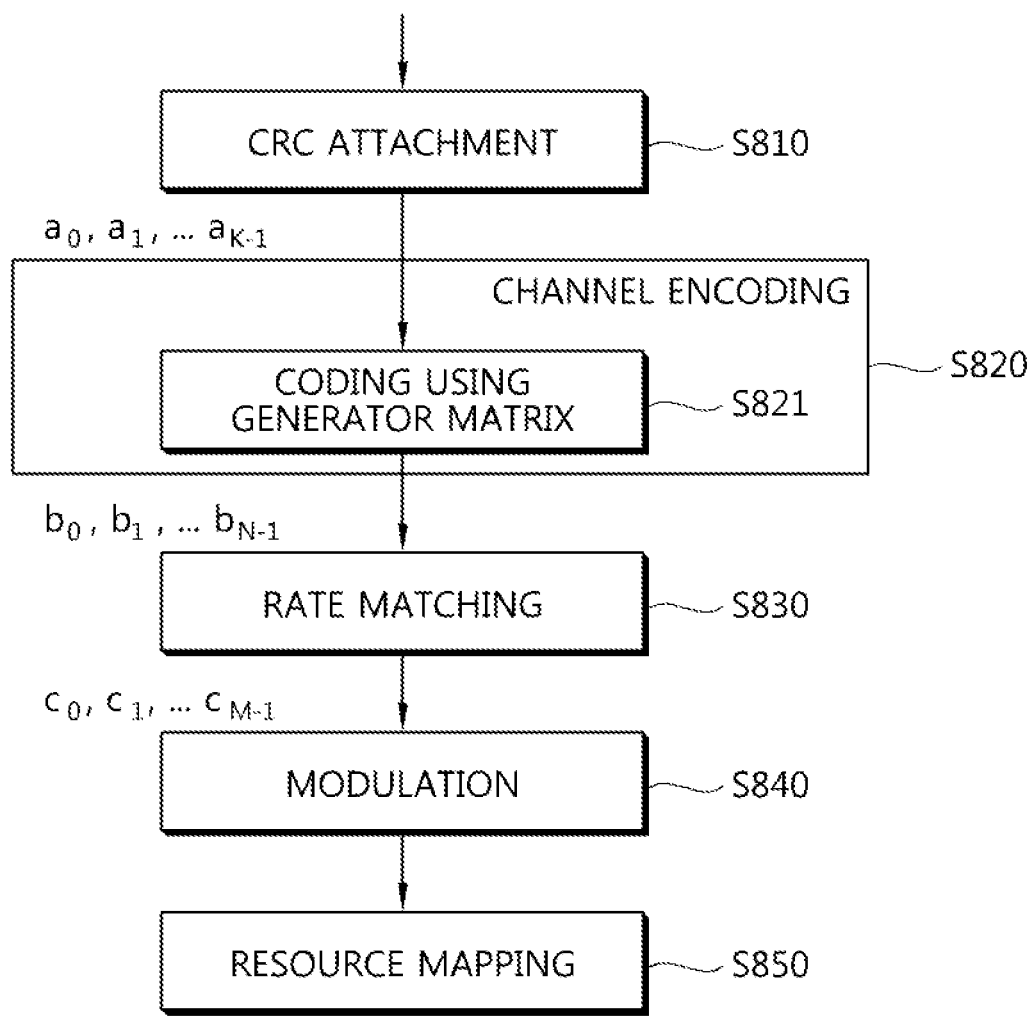

FIG. 9A

| N=256 | $W_{256,i}$ | i | $W_{256,i}$ | i | $W_{256,i}$ | i | $W_{256,i}$ | i | $W_{256,i}$ | i | $W_{256,i}$ | i | $W_{256,i}$ | i | $W_{256,i}$ |
|---|---|---|---|---|---|---|---|---|---|---|---|---|---|---|---|
| 0 | 255 | 32 | 126 | 64 | 179 | 96 | 198 | 128 | 55 | 160 | 71 | 192 | 133 | 224 | 160 |
| 1 | 254 | 33 | 241 | 65 | 122 | 97 | 172 | 129 | 92 | 161 | 23 | 193 | 88 | 225 | 52 |
| 2 | 253 | 34 | 234 | 66 | 199 | 98 | 93 | 130 | 105 | 162 | 39 | 194 | 81 | 226 | 26 |
| 3 | 251 | 35 | 125 | 67 | 173 | 99 | 177 | 131 | 176 | 163 | 7 | 195 | 69 | 227 | 42 |
| 4 | 247 | 36 | 220 | 68 | 228 | 100 | 120 | 132 | 31 | 164 | 77 | 196 | 21 | 228 | 28 |
| 5 | 239 | 37 | 233 | 69 | 121 | 101 | 103 | 133 | 47 | 165 | 162 | 197 | 37 | 229 | 44 |
| 6 | 223 | 38 | 175 | 70 | 216 | 102 | 197 | 134 | 102 | 166 | 54 | 198 | 5 | 230 | 10 |
| 7 | 252 | 39 | 230 | 71 | 118 | 103 | 170 | 135 | 149 | 167 | 75 | 199 | 73 | 231 | 130 |
| 8 | 250 | 40 | 123 | 72 | 171 | 104 | 62 | 136 | 196 | 168 | 104 | 200 | 49 | 232 | 66 |
| 9 | 191 | 41 | 218 | 73 | 226 | 105 | 116 | 137 | 142 | 169 | 51 | 201 | 25 | 233 | 18 |
| 10 | 249 | 42 | 229 | 74 | 158 | 106 | 143 | 138 | 90 | 170 | 161 | 202 | 41 | 234 | 34 |
| 11 | 246 | 43 | 217 | 75 | 63 | 107 | 91 | 139 | 101 | 171 | 53 | 203 | 9 | 235 | 2 |
| 12 | 245 | 44 | 119 | 76 | 117 | 108 | 224 | 140 | 147 | 172 | 30 | 204 | 129 | 236 | 144 |
| 13 | 238 | 45 | 214 | 77 | 212 | 109 | 156 | 141 | 168 | 173 | 27 | 205 | 65 | 237 | 96 |
| 14 | 243 | 46 | 188 | 78 | 225 | 110 | 169 | 142 | 194 | 174 | 46 | 206 | 17 | 238 | 136 |
| 15 | 237 | 47 | 227 | 79 | 157 | 111 | 195 | 143 | 141 | 175 | 43 | 207 | 33 | 239 | 12 |
| 16 | 127 | 48 | 159 | 80 | 110 | 112 | 61 | 144 | 60 | 176 | 148 | 208 | 1 | 240 | 132 |
| 17 | 222 | 49 | 213 | 81 | 115 | 113 | 114 | 145 | 89 | 177 | 29 | 209 | 98 | 241 | 80 |
| 18 | 235 | 50 | 186 | 82 | 210 | 114 | 166 | 146 | 99 | 178 | 45 | 210 | 138 | 242 | 68 |
| 19 | 221 | 51 | 206 | 83 | 167 | 115 | 87 | 147 | 86 | 179 | 11 | 211 | 192 | 243 | 20 |
| 20 | 231 | 52 | 111 | 84 | 184 | 116 | 108 | 148 | 139 | 180 | 131 | 212 | 14 | 244 | 36 |
| 21 | 219 | 53 | 211 | 85 | 204 | 117 | 154 | 149 | 193 | 181 | 67 | 213 | 134 | 245 | 4 |
| 22 | 190 | 54 | 185 | 86 | 109 | 118 | 208 | 150 | 15 | 182 | 19 | 214 | 84 | 246 | 72 |
| 23 | 248 | 55 | 182 | 87 | 155 | 119 | 113 | 151 | 135 | 183 | 35 | 215 | 82 | 247 | 48 |
| 24 | 215 | 56 | 205 | 88 | 209 | 120 | 59 | 152 | 112 | 184 | 3 | 216 | 56 | 248 | 24 |
| 25 | 189 | 57 | 240 | 89 | 180 | 121 | 165 | 153 | 58 | 185 | 145 | 217 | 70 | 249 | 40 |
| 26 | 244 | 58 | 181 | 90 | 202 | 122 | 79 | 154 | 164 | 186 | 100 | 218 | 22 | 250 | 8 |
| 27 | 187 | 59 | 124 | 91 | 94 | 123 | 106 | 155 | 85 | 187 | 146 | 219 | 38 | 251 | 128 |
| 28 | 207 | 60 | 203 | 92 | 107 | 124 | 153 | 156 | 78 | 188 | 97 | 220 | 6 | 252 | 0 |
| 29 | 242 | 61 | 232 | 93 | 178 | 125 | 200 | 157 | 83 | 189 | 137 | 221 | 76 | 253 | 16 |
| 30 | 236 | 62 | 95 | 94 | 201 | 126 | 150 | 158 | 152 | 190 | 13 | 222 | 74 | 254 | 32 |
| 31 | 183 | 63 | 174 | 95 | 151 | 127 | 163 | 159 | 57 | 191 | 140 | 223 | 50 | 255 | 64 |

| i | $W_{128,i}$ | i | $W_{128,i}$ | i | $W_{128,i}$ | i | $W_{128,i}$ | i | $W_{128,i}$ | i | $W_{128,i}$ | i | $W_{128,i}$ | i | $W_{128,i}$ |
|---|---|---|---|---|---|---|---|---|---|---|---|---|---|---|---|
| 0 | 127 | 16 | 107 | 32 | 55 | 48 | 57 | 64 | 30 | 80 | 44 | 96 | 80 | 112 | 66 |
| 1 | 126 | 17 | 94 | 33 | 105 | 49 | 83 | 65 | 43 | 81 | 49 | 97 | 26 | 113 | 40 |
| 2 | 125 | 18 | 93 | 34 | 92 | 50 | 54 | 66 | 56 | 82 | 69 | 98 | 13 | 114 | 34 |
| 3 | 123 | 19 | 103 | 35 | 102 | 51 | 77 | 67 | 29 | 83 | 96 | 99 | 21 | 115 | 10 |
| 4 | 119 | 20 | 91 | 36 | 90 | 52 | 104 | 68 | 82 | 84 | 7 | 100 | 14 | 116 | 18 |
| 5 | 111 | 21 | 120 | 37 | 101 | 53 | 53 | 69 | 39 | 85 | 67 | 101 | 22 | 117 | 2 |
| 6 | 95 | 22 | 62 | 38 | 47 | 54 | 100 | 70 | 76 | 86 | 42 | 102 | 5 | 118 | 36 |
| 7 | 124 | 23 | 116 | 39 | 89 | 55 | 75 | 71 | 81 | 87 | 41 | 103 | 65 | 119 | 24 |
| 8 | 122 | 24 | 87 | 40 | 99 | 56 | 46 | 72 | 27 | 88 | 28 | 104 | 33 | 120 | 12 |
| 9 | 121 | 25 | 61 | 41 | 86 | 57 | 88 | 73 | 52 | 89 | 35 | 105 | 9 | 121 | 20 |
| 10 | 118 | 26 | 114 | 42 | 60 | 58 | 51 | 74 | 15 | 90 | 11 | 106 | 17 | 122 | 4 |
| 11 | 63 | 27 | 108 | 43 | 85 | 59 | 98 | 75 | 23 | 91 | 19 | 107 | 1 | 123 | 64 |
| 12 | 117 | 28 | 59 | 44 | 31 | 60 | 71 | 76 | 74 | 92 | 3 | 108 | 72 | 124 | 32 |
| 13 | 110 | 29 | 113 | 45 | 58 | 61 | 45 | 77 | 50 | 93 | 38 | 109 | 48 | 125 | 8 |
| 14 | 115 | 30 | 79 | 46 | 112 | 62 | 84 | 78 | 73 | 94 | 37 | 110 | 68 | 126 | 16 |
| 15 | 109 | 31 | 106 | 47 | 78 | 63 | 97 | 79 | 70 | 95 | 25 | 111 | 6 | 127 | 0 |

| i | $W_{64,i}$ | i | $W_{64,i}$ | i | $W_{64,i}$ | i | $W_{64,i}$ |
|---|---|---|---|---|---|---|---|
| 0 | 63 | 16 | 30 | 32 | 37 | 48 | 33 |
| 1 | 62 | 17 | 29 | 33 | 25 | 49 | 20 |
| 2 | 61 | 18 | 56 | 34 | 35 | 50 | 17 |
| 3 | 59 | 19 | 39 | 35 | 22 | 51 | 5 |
| 4 | 55 | 20 | 27 | 36 | 48 | 52 | 9 |
| 5 | 47 | 21 | 52 | 37 | 21 | 53 | 1 |
| 6 | 60 | 22 | 50 | 38 | 14 | 54 | 18 |
| 7 | 31 | 23 | 23 | 39 | 19 | 55 | 12 |
| 8 | 58 | 24 | 44 | 40 | 40 | 56 | 6 |
| 9 | 57 | 25 | 49 | 41 | 13 | 57 | 10 |
| 10 | 54 | 26 | 42 | 42 | 7 | 58 | 2 |
| 11 | 53 | 27 | 15 | 43 | 11 | 59 | 32 |
| 12 | 46 | 28 | 28 | 44 | 36 | 60 | 16 |
| 13 | 51 | 29 | 41 | 45 | 24 | 61 | 4 |
| 14 | 45 | 30 | 38 | 46 | 34 | 62 | 8 |
| 15 | 43 | 31 | 26 | 47 | 3 | 63 | 0 |

| i | $w_{32,i}$ | i | $w_{32,i}$ |
|---|---|---|---|
| 0 | 31 | 16 | 7 |
| 1 | 30 | 17 | 20 |
| 2 | 29 | 18 | 18 |
| 3 | 27 | 19 | 12 |
| 4 | 23 | 20 | 17 |
| 5 | 15 | 21 | 10 |
| 6 | 28 | 22 | 9 |
| 7 | 26 | 23 | 6 |
| 8 | 25 | 24 | 3 |
| 9 | 22 | 25 | 5 |
| 10 | 21 | 26 | 1 |
| 11 | 14 | 27 | 16 |
| 12 | 19 | 28 | 8 |
| 13 | 13 | 29 | 2 |
| 14 | 11 | 30 | 4 |
| 15 | 24 | 31 | 0 |

| i | $w_{16,i}$ |
|---|---|
| 0 | 15 |
| 1 | 14 |
| 2 | 13 |
| 3 | 11 |
| 4 | 7 |
| 5 | 12 |
| 6 | 10 |
| 7 | 9 |
| 8 | 6 |
| 9 | 5 |
| 10 | 3 |
| 11 | 8 |
| 12 | 4 |
| 13 | 1 |
| 14 | 2 |
| 15 | 0 |

| i | $W_{192,i}$ | i | $W_{192,i}$ | i | $W_{192,i}$ | i | $W_{192,i}$ | i | $W_{192,i}$ | i | $W_{192,i}$ | i | $W_{192,i}$ | i | $W_{192,i}$ |
|---|---|---|---|---|---|---|---|---|---|---|---|---|---|---|---|
| 0 | 191 | 24 | 180 | 48 | 142 | 72 | 161 | 96 | 43 | 120 | 99 | 144 | 25 | 168 | 84 |
| 1 | 190 | 25 | 126 | 49 | 147 | 73 | 57 | 97 | 108 | 121 | 89 | 145 | 26 | 169 | 40 |
| 2 | 189 | 26 | 178 | 50 | 176 | 74 | 146 | 98 | 160 | 122 | 71 | 146 | 13 | 170 | 74 |
| 3 | 187 | 27 | 125 | 51 | 55 | 75 | 54 | 99 | 79 | 123 | 86 | 147 | 21 | 171 | 34 |
| 4 | 183 | 28 | 143 | 52 | 95 | 76 | 94 | 100 | 113 | 124 | 7 | 148 | 14 | 172 | 76 |
| 5 | 175 | 29 | 172 | 53 | 141 | 77 | 140 | 101 | 56 | 125 | 132 | 149 | 104 | 173 | 10 |
| 6 | 159 | 30 | 177 | 54 | 122 | 78 | 107 | 102 | 29 | 126 | 42 | 150 | 22 | 174 | 18 |
| 7 | 188 | 31 | 123 | 55 | 121 | 79 | 145 | 103 | 39 | 127 | 83 | 151 | 97 | 175 | 66 |
| 8 | 186 | 32 | 170 | 56 | 168 | 80 | 53 | 104 | 131 | 128 | 85 | 152 | 69 | 176 | 2 |
| 9 | 185 | 33 | 156 | 57 | 139 | 81 | 120 | 105 | 106 | 129 | 78 | 153 | 5 | 177 | 36 |
| 10 | 182 | 34 | 169 | 58 | 118 | 82 | 93 | 106 | 27 | 130 | 112 | 154 | 81 | 178 | 128 |
| 11 | 181 | 35 | 119 | 59 | 47 | 83 | 138 | 107 | 144 | 131 | 41 | 155 | 73 | 179 | 24 |
| 12 | 127 | 36 | 166 | 60 | 117 | 84 | 103 | 108 | 52 | 132 | 75 | 156 | 33 | 180 | 12 |
| 13 | 174 | 37 | 62 | 61 | 164 | 85 | 46 | 109 | 92 | 133 | 28 | 157 | 9 | 181 | 20 |
| 14 | 179 | 38 | 154 | 62 | 60 | 86 | 116 | 110 | 15 | 134 | 35 | 158 | 17 | 182 | 96 |
| 15 | 173 | 39 | 165 | 63 | 152 | 87 | 51 | 111 | 105 | 135 | 77 | 159 | 65 | 183 | 68 |
| 16 | 158 | 40 | 61 | 64 | 135 | 88 | 91 | 112 | 23 | 136 | 11 | 160 | 1 | 184 | 4 |
| 17 | 171 | 41 | 153 | 65 | 110 | 89 | 137 | 113 | 102 | 137 | 19 | 161 | 100 | 185 | 80 |
| 18 | 157 | 42 | 150 | 66 | 162 | 90 | 45 | 114 | 50 | 138 | 38 | 162 | 48 | 186 | 72 |
| 19 | 167 | 43 | 111 | 67 | 115 | 91 | 134 | 115 | 90 | 139 | 130 | 163 | 98 | 187 | 32 |
| 20 | 63 | 44 | 163 | 68 | 58 | 92 | 114 | 116 | 136 | 140 | 67 | 164 | 88 | 188 | 8 |
| 21 | 155 | 45 | 59 | 69 | 31 | 93 | 30 | 117 | 101 | 141 | 3 | 165 | 70 | 189 | 16 |
| 22 | 184 | 46 | 149 | 70 | 148 | 94 | 87 | 118 | 44 | 142 | 37 | 166 | 6 | 190 | 0 |
| 23 | 151 | 47 | 124 | 71 | 109 | 95 | 133 | 119 | 49 | 143 | 129 | 167 | 82 | 191 | 64 |

| i | $W_{96,i}$ | i | $W_{96,i}$ | i | $W_{96,i}$ | i | $W_{96,i}$ |
|---|---|---|---|---|---|---|---|
| 0 | 95 | 24 | 30 | 48 | 51 | 72 | 42 |
| 1 | 94 | 25 | 76 | 49 | 25 | 73 | 20 |
| 2 | 93 | 26 | 55 | 50 | 45 | 74 | 37 |
| 3 | 91 | 27 | 81 | 51 | 68 | 75 | 17 |
| 4 | 87 | 28 | 29 | 52 | 22 | 76 | 38 |
| 5 | 79 | 29 | 74 | 53 | 43 | 77 | 5 |
| 6 | 92 | 30 | 73 | 54 | 66 | 78 | 9 |
| 7 | 90 | 31 | 27 | 55 | 21 | 79 | 33 |
| 8 | 63 | 32 | 47 | 56 | 39 | 80 | 1 |
| 9 | 89 | 33 | 70 | 57 | 56 | 81 | 18 |
| 10 | 86 | 34 | 60 | 58 | 14 | 82 | 64 |
| 11 | 85 | 35 | 69 | 59 | 19 | 83 | 12 |
| 12 | 78 | 36 | 23 | 60 | 65 | 84 | 6 |
| 13 | 83 | 37 | 58 | 61 | 13 | 85 | 10 |
| 14 | 31 | 38 | 67 | 62 | 7 | 86 | 48 |
| 15 | 77 | 39 | 57 | 63 | 52 | 87 | 34 |
| 16 | 75 | 40 | 15 | 64 | 11 | 88 | 2 |
| 17 | 62 | 41 | 54 | 65 | 50 | 89 | 40 |
| 18 | 71 | 42 | 80 | 66 | 24 | 90 | 36 |
| 19 | 88 | 43 | 28 | 67 | 49 | 91 | 16 |
| 20 | 61 | 44 | 53 | 68 | 44 | 92 | 4 |
| 21 | 84 | 45 | 72 | 69 | 35 | 93 | 8 |
| 22 | 59 | 46 | 26 | 70 | 3 | 94 | 32 |
| 23 | 82 | 47 | 46 | 71 | 41 | 95 | 0 |

| i | $W_{48,i}$ | i | $W_{48,i}$ |
|---|---|---|---|
| 0 | 47 | 24 | 28 |
| 1 | 46 | 25 | 7 |
| 2 | 45 | 26 | 26 |
| 3 | 43 | 27 | 25 |
| 4 | 39 | 28 | 12 |
| 5 | 31 | 29 | 22 |
| 6 | 44 | 30 | 21 |
| 7 | 42 | 31 | 10 |
| 8 | 41 | 32 | 19 |
| 9 | 15 | 33 | 9 |
| 10 | 38 | 34 | 32 |
| 11 | 37 | 35 | 6 |
| 12 | 35 | 36 | 3 |
| 13 | 30 | 37 | 5 |
| 14 | 29 | 38 | 24 |
| 15 | 27 | 39 | 17 |
| 16 | 40 | 40 | 1 |
| 17 | 14 | 41 | 20 |
| 18 | 36 | 42 | 18 |
| 19 | 13 | 43 | 8 |
| 20 | 23 | 44 | 2 |
| 21 | 34 | 45 | 4 |
| 22 | 11 | 46 | 16 |
| 23 | 33 | 47 | 0 |

| i | $w_{24,i}$ |
|---|---|
| 0 | 23 |
| 1 | 22 |
| 2 | 21 |
| 3 | 19 |
| 4 | 15 |
| 5 | 20 |
| 6 | 7 |
| 7 | 18 |
| 8 | 17 |
| 9 | 14 |
| 10 | 13 |
| 11 | 6 |
| 12 | 11 |
| 13 | 5 |
| 14 | 16 |
| 15 | 3 |
| 16 | 12 |
| 17 | 10 |
| 18 | 9 |
| 19 | 4 |
| 20 | 1 |
| 21 | 2 |
| 22 | 8 |
| 23 | 0 |

FIG. 11

| N | mode | $M_{MAX}$ | $M_{MIN}$ |
|---|---|---|---|
| 256 | 0 | 320 | 208 |
| | 1 | 208 | 144 |
| 128 | 0 | 144 | 104 |
| | 1 | 104 | 72 |
| 64 | 0 | 72 | 52 |
| | 1 | 52 | 36 |
| 32 | 0 | 36 | 26 |
| | 1 | 26 | 18 |
| 16 | 0 | 18 | 10 |
| | 1 | 10 | 0 |

FIG. 12A

N=64, mode=0

| i | $W_{64,i}$ | i | $W_{64,i}$ | i | $W_{64,i}$ | i | $W_{64,i}$ |
|---|---|---|---|---|---|---|---|
| 0 | 63 | 16 | 30 | 32 | 37 | 48 | 33 |
| 1 | 62 | 17 | 29 | 33 | 25 | 49 | 20 |
| 2 | 61 | 18 | 56 | 34 | 35 | 50 | 17 |
| 3 | 59 | 19 | 39 | 35 | 22 | 51 | 5 |
| 4 | 55 | 20 | 27 | 36 | 48 | 52 | 9 |
| 5 | 47 | 21 | 52 | 37 | 21 | 53 | 1 |
| 6 | 60 | 22 | 50 | 38 | 14 | 54 | 18 |
| 7 | 31 | 23 | 23 | 39 | 19 | 55 | 12 |
| 8 | 58 | 24 | 44 | 40 | 40 | 56 | 6 |
| 9 | 57 | 25 | 49 | 41 | 13 | 57 | 10 |
| 10 | 54 | 26 | 42 | 42 | 7 | 58 | 2 |
| 11 | 53 | 27 | 15 | 43 | 11 | 59 | 32 |
| 12 | 46 | 28 | 28 | 44 | 36 | 60 | 16 |
| 13 | 51 | 29 | 41 | 45 | 24 | 61 | 4 |
| 14 | 45 | 30 | 38 | 46 | 34 | 62 | 8 |
| 15 | 43 | 31 | 26 | 47 | 3 | 63 | 0 |

FIG. 12B

N=64, mode=1

| i | $W_{64,i}$ | i | $W_{64,i}$ | i | $W_{64,i}$ | i | $W_{64,i}$ |
|---|---|---|---|---|---|---|---|
| 0 | 63 | 16 | 56 | 32 | 15 | 48 | 1 |
| 1 | 62 | 17 | 30 | 33 | 35 | 49 | 36 |
| 2 | 61 | 18 | 52 | 34 | 25 | 50 | 14 |
| 3 | 59 | 19 | 29 | 35 | 48 | 51 | 34 |
| 4 | 55 | 20 | 39 | 36 | 7 | 52 | 24 |
| 5 | 47 | 21 | 50 | 37 | 22 | 53 | 6 |
| 6 | 60 | 22 | 27 | 38 | 19 | 54 | 18 |
| 7 | 58 | 23 | 49 | 39 | 21 | 55 | 20 |
| 8 | 57 | 24 | 44 | 40 | 11 | 56 | 10 |
| 9 | 31 | 25 | 23 | 41 | 3 | 57 | 2 |
| 10 | 54 | 26 | 42 | 42 | 40 | 58 | 12 |
| 11 | 53 | 27 | 41 | 43 | 13 | 59 | 32 |
| 12 | 51 | 28 | 28 | 44 | 33 | 60 | 4 |
| 13 | 46 | 29 | 38 | 45 | 5 | 61 | 16 |
| 14 | 45 | 30 | 37 | 46 | 17 | 62 | 8 |
| 15 | 43 | 31 | 26 | 47 | 9 | 63 | 0 |

FIG. 13A

N=128, mode=0

| i | $W_{128,i}$ | i | $W_{128,i}$ | i | $W_{128,i}$ | i | $W_{128,i}$ | i | $W_{128,i}$ | i | $W_{128,i}$ | i | $W_{128,i}$ | i | $W_{128,i}$ |
|---|---|---|---|---|---|---|---|---|---|---|---|---|---|---|---|
| 0 | 127 | 16 | 107 | 32 | 105 | 48 | 57 | 64 | 39 | 80 | 76 | 96 | 1 | 112 | 2 |
| 1 | 126 | 17 | 94 | 33 | 92 | 49 | 83 | 65 | 43 | 81 | 73 | 97 | 70 | 113 | 80 |
| 2 | 125 | 18 | 93 | 34 | 55 | 50 | 104 | 66 | 23 | 82 | 52 | 98 | 50 | 114 | 72 |
| 3 | 123 | 19 | 103 | 35 | 102 | 51 | 54 | 67 | 29 | 83 | 69 | 99 | 14 | 115 | 68 |
| 4 | 119 | 20 | 120 | 36 | 90 | 52 | 77 | 68 | 97 | 84 | 49 | 100 | 44 | 116 | 48 |
| 5 | 111 | 21 | 91 | 37 | 101 | 53 | 53 | 69 | 27 | 85 | 13 | 101 | 38 | 117 | 12 |
| 6 | 124 | 22 | 62 | 38 | 47 | 54 | 75 | 70 | 7 | 86 | 74 | 102 | 42 | 118 | 36 |
| 7 | 95 | 23 | 116 | 39 | 89 | 55 | 100 | 71 | 84 | 87 | 37 | 103 | 22 | 119 | 40 |
| 8 | 122 | 24 | 61 | 40 | 60 | 56 | 46 | 72 | 56 | 88 | 41 | 104 | 28 | 120 | 20 |
| 9 | 121 | 25 | 87 | 41 | 31 | 57 | 71 | 73 | 82 | 89 | 21 | 105 | 96 | 121 | 24 |
| 10 | 118 | 26 | 114 | 42 | 86 | 58 | 51 | 74 | 67 | 90 | 25 | 106 | 26 | 122 | 4 |
| 11 | 63 | 27 | 108 | 43 | 99 | 59 | 15 | 75 | 11 | 91 | 5 | 107 | 6 | 123 | 64 |
| 12 | 117 | 28 | 113 | 44 | 112 | 60 | 88 | 76 | 35 | 92 | 65 | 108 | 66 | 124 | 8 |
| 13 | 110 | 29 | 59 | 45 | 58 | 61 | 45 | 77 | 19 | 93 | 9 | 109 | 10 | 125 | 0 |
| 14 | 115 | 30 | 106 | 46 | 85 | 62 | 30 | 78 | 3 | 94 | 33 | 110 | 34 | 126 | 16 |
| 15 | 109 | 31 | 79 | 47 | 78 | 63 | 98 | 79 | 81 | 95 | 17 | 111 | 18 | 127 | 32 |

FIG. 13B

| N=128, mode=1 | | | | | | | | | | | |
|---|---|---|---|---|---|---|---|---|---|---|---|
| i | $W_{128,i}$ | i | $W_{128,i}$ | i | $W_{128,i}$ | i | $W_{128,i}$ | i | $W_{128,i}$ | i | $W_{128,i}$ |
| 0 | 127 | 16 | 107 | 32 | 55 | 48 | 57 | 64 | 30 | 80 | 44 | 96 | 80 | 112 | 66 |
| 1 | 126 | 17 | 94 | 33 | 105 | 49 | 83 | 65 | 43 | 81 | 49 | 97 | 26 | 113 | 40 |
| 2 | 125 | 18 | 93 | 34 | 92 | 50 | 54 | 66 | 56 | 82 | 69 | 98 | 13 | 114 | 34 |
| 3 | 123 | 19 | 103 | 35 | 102 | 51 | 77 | 67 | 29 | 83 | 96 | 99 | 21 | 115 | 10 |
| 4 | 119 | 20 | 91 | 36 | 90 | 52 | 104 | 68 | 82 | 84 | 7 | 100 | 14 | 116 | 18 |
| 5 | 111 | 21 | 120 | 37 | 101 | 53 | 53 | 69 | 39 | 85 | 67 | 101 | 22 | 117 | 2 |
| 6 | 95 | 22 | 62 | 38 | 47 | 54 | 100 | 70 | 76 | 86 | 42 | 102 | 5 | 118 | 36 |
| 7 | 124 | 23 | 116 | 39 | 89 | 55 | 75 | 71 | 81 | 87 | 41 | 103 | 65 | 119 | 24 |
| 8 | 122 | 24 | 87 | 40 | 99 | 56 | 46 | 72 | 27 | 88 | 28 | 104 | 33 | 120 | 12 |
| 9 | 121 | 25 | 61 | 41 | 86 | 57 | 88 | 73 | 52 | 89 | 35 | 105 | 9 | 121 | 20 |
| 10 | 118 | 26 | 114 | 42 | 60 | 58 | 51 | 74 | 15 | 90 | 11 | 106 | 17 | 122 | 4 |
| 11 | 63 | 27 | 108 | 43 | 85 | 59 | 98 | 75 | 23 | 91 | 19 | 107 | 1 | 123 | 64 |
| 12 | 117 | 28 | 59 | 44 | 31 | 60 | 71 | 76 | 74 | 92 | 3 | 108 | 72 | 124 | 32 |
| 13 | 110 | 29 | 113 | 45 | 58 | 61 | 45 | 77 | 50 | 93 | 38 | 109 | 48 | 125 | 8 |
| 14 | 115 | 30 | 79 | 46 | 112 | 62 | 84 | 78 | 73 | 94 | 37 | 110 | 68 | 126 | 16 |
| 15 | 109 | 31 | 106 | 47 | 78 | 63 | 97 | 79 | 70 | 95 | 25 | 111 | 6 | 127 | 0 |

FIG. 13C

| N=128, mode=2 | | | | | | | | | | | | | | | |
|---|---|---|---|---|---|---|---|---|---|---|---|---|---|---|---|
| i | $W_{128,i}$ | i | $W_{128,i}$ | i | $W_{128,i}$ | i | $W_{128,i}$ | i | $W_{128,i}$ | i | $W_{128,i}$ | i | $W_{128,i}$ | i | $W_{128,i}$ |
| 0 | 127 | 16 | 94 | 32 | 106 | 48 | 54 | 64 | 29 | 80 | 49 | 96 | 21 | 112 | 18 |
| 1 | 126 | 17 | 107 | 33 | 47 | 49 | 83 | 65 | 84 | 81 | 42 | 97 | 48 | 113 | 12 |
| 2 | 125 | 18 | 93 | 34 | 105 | 50 | 77 | 66 | 39 | 82 | 15 | 98 | 14 | 114 | 17 |
| 3 | 123 | 19 | 103 | 35 | 92 | 51 | 112 | 67 | 97 | 83 | 69 | 99 | 68 | 115 | 10 |
| 4 | 119 | 20 | 91 | 36 | 102 | 52 | 53 | 68 | 56 | 84 | 41 | 100 | 19 | 116 | 64 |
| 5 | 111 | 21 | 62 | 37 | 90 | 53 | 46 | 69 | 27 | 85 | 28 | 101 | 40 | 117 | 9 |
| 6 | 95 | 22 | 120 | 38 | 101 | 54 | 75 | 70 | 82 | 86 | 38 | 102 | 13 | 118 | 3 |
| 7 | 124 | 23 | 61 | 39 | 89 | 55 | 104 | 71 | 76 | 87 | 96 | 103 | 66 | 119 | 6 |
| 8 | 122 | 24 | 87 | 40 | 60 | 56 | 51 | 72 | 52 | 88 | 67 | 104 | 36 | 120 | 5 |
| 9 | 63 | 25 | 116 | 41 | 31 | 57 | 45 | 73 | 81 | 89 | 26 | 105 | 11 | 121 | 32 |
| 10 | 121 | 26 | 59 | 42 | 86 | 58 | 71 | 74 | 23 | 90 | 37 | 106 | 65 | 122 | 1 |
| 11 | 118 | 27 | 79 | 43 | 99 | 59 | 100 | 75 | 74 | 91 | 25 | 107 | 24 | 123 | 16 |
| 12 | 117 | 28 | 114 | 44 | 58 | 60 | 43 | 76 | 50 | 92 | 80 | 108 | 7 | 124 | 8 |
| 13 | 110 | 29 | 108 | 45 | 85 | 61 | 88 | 77 | 44 | 93 | 22 | 109 | 34 | 125 | 2 |
| 14 | 115 | 30 | 55 | 46 | 78 | 62 | 30 | 78 | 73 | 94 | 35 | 110 | 20 | 126 | 4 |
| 15 | 109 | 31 | 113 | 47 | 57 | 63 | 98 | 79 | 70 | 95 | 72 | 111 | 33 | 127 | 0 |

METHOD AND TERMINAL FOR CHANNEL ENCODING USING POLAR CODE

CROSS-REFERENCE TO RELATED APPLICATIONS

This application is a National Stage application under 35 U.S.C. § 371 of International Application No. PCT/KR2018/000084, filed on Jan. 3, 2018, which claims the benefit of U.S. Provisional Application No. 62/442,959, filed on Jan. 5, 2017. The disclosures of the prior applications are incorporated by reference in their entirety.

TECHNICAL FIELD

The present invention relates to mobile communication.

BACKGROUND ART

Thanks to success of long term evolution (LTE)/LTE-advanced (LTE-A) for 4G mobile communication, interest in future mobile communication, that is, 5G mobile communication, is increasing and studies thereon are continuing.

In next-generation mobile communication, that is, 5G mobile communication, a data service having a minimum speed of 1 Gbps seems to be realized.

In 5G mobile communication, use of one of a turbo code, a polar code, a low density parity check (LDPC) code, etc. as a channel coding method has been discussed.

However, there has been a problem that efficiency is reduced when the polar code is used.

DISCLOSURE

Technical Problem

Accordingly, this disclosure is to solve the above-described problems.

Technical Solution

The object of the present invention can be achieved by providing a method of performing channel encoding. The method includes interleaving information bits and encoding the interleaved information bits into a polar code. The information bits may be interleaved according to an interleaving pattern.

The interleaving pattern may be determined according to a value of N, and N may indicate a size of the information bits.

The interleaving pattern may be predefined in the form of a table.

The information bits may be reordered in ascending order of reliability.

When the information bits have a size of K, bits output after encoding may have a size of N.

The information bits may include uplink control information (UCI) of a physical uplink control channel (PUCCH).

The information bits may include uplink control information (UCI) of a physical uplink shared channel (PUSCH).

The information bits may include downlink control information (DCI) of a downlink control channel or data of a downlink data channel.

In another aspect of the present invention, provided herein is a user equipment (UE) for performing channel encoding. The UE may include a transceiver and a processor for controlling the transceiver. The processor may perform a process of interleaving information bits and a process of encoding the interleaved information bits into a polar code. The information bits may be interleaved according to an interleaving pattern.

Advantageous Effects

According to this disclosure, it is possible to solve the above-described problems.

DESCRIPTION OF DRAWINGS

FIG. 7 is a table showing an example of basis sequences having a size of N=32.

FIG. 8 is a flowchart illustrating a data transmission process according to this disclosure.

FIGS. 9a to 9e are tables of codeword patterns with respect to N which is the exponent of 2.

FIGS. 10a to 10d are tables of codeword patterns when m=2 is considered and $N=(m^n+m^{n+1})/2$ is satisfied.

FIG. 11 is a table for determining a value of N.

FIGS. 12a and 12b are tables of codeword patterns selectable according to mode determined according to a size of M in the case of N=64.

FIGS. 13a to 13c are views showing examples of codeword patterns available in the case of N=128.

MODE FOR INVENTION

Figure 1:
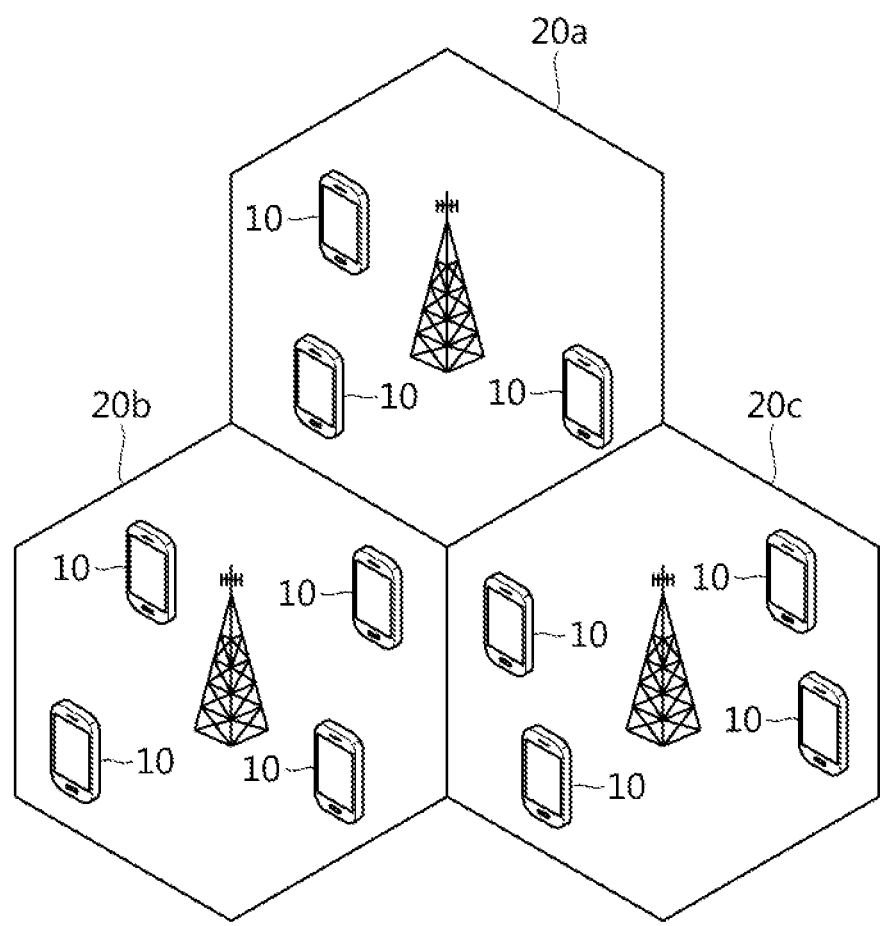
FIG. 1 is a view showing a wireless communication system.

Hereinafter, the present invention applied to 3GPP (3rd Generation Partnership Project), 3GPP LTE (long term evolution) or 3GPP LTE-A (LTE-Advanced) will be described. This is merely exemplary and the present invention is applicable to various wireless communication systems. Hereinafter, LTE includes LTE and/or LTE-A.

Technical terms used in this specification are used merely to illustrate specific embodiments, and it should be understood that they are not intended to limit the present disclosure. So long as not defined otherwise, all terms used herein including technical terms may have the same meaning as generally understood by an ordinary person skilled in the art to which the present disclosure pertains, and should not be construed in an excessively comprehensive manner or an extremely restricted manner. In addition, if a technical term used in the description of the present disclosure is an erroneous term that fails to clearly express the idea of the present disclosure, it should be replaced by a technical term that can be properly understood by those skilled in the art. In addition, general terms used in the description of the present disclosure should be construed according to definitions in dictionaries or according to context, and should not be construed in an excessively restrained manner.

A singular representation may include a plural representation unless context clearly indicates otherwise. It will be understood that the terms 'comprising', 'include', etc., when used in this specification, specify the presence of several components or several steps and part of the components or steps may not be included or additional components or steps may be further included.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It will be understood that when an element is referred to as being "connected to" another element, the element can be directly connected to the other element or intervening elements may also be present. In contrast, when an element is referred to as being "directly connected to" another element, there are no intervening elements present.

Exemplary embodiments of the present invention will be described below in detail with reference to the accompanying drawings in which the same reference numbers are used throughout this specification to refer to the same or like parts. In describing the present invention, a detailed description of known functions and configurations will be omitted when it may obscure the subject matter of the present invention. The accompanying drawings are used to help easily understood the technical idea of the present invention and it should be understood that the idea of the present invention is not limited by the accompanying drawings. The idea of the present invention should be construed to extend to any alterations, equivalents and substitutions besides the accompanying drawings.

The term base station used hereinafter refers to a fixed station communicating with a wireless device and may also be referred to as eNodeB (evolved-NodeB), eNB (evolved-NodeB), BTS (base transceiver system), access point, etc.

In addition, the term user equipment (UE) used hereinafter may be fixed or movable and may also be referred to as device, wireless device, terminal, mobile station (MS), user terminal (UT), subscriber station (SS), mobile terminal (MT), etc.

FIG. 1 is a view showing a wireless communication system.

Referring to FIG. 1, the wireless communication system includes at least one base station (BS) 20. Each base station 20 provides a communication service to specific geographical regions (generally, referred to as cells) 20a, 20b and 20c. The cell may be divided into a plurality of regions (referred to as sectors).

A UE generally belongs to one cell and a cell, to which the UE belongs, is referred to as a serving cell. A base station for providing a communication service to the serving cell is referred to as a serving BS. The wireless communication system is a cellular system and thus other cells are located adjacent to the serving cell. The other cells located adjacent to the serving cell are referred to as neighbor cells. BSs for providing communication services to the neighbor cells are referred to as neighbor BSs. The serving cell and the neighbor cell are determined based on the UE.

Hereinafter, downlink means communication from the BS 20 to the UE 10 and uplink means communication from the UE 10 to the BS 20. On downlink, a transmitter may be a portion of the BS 20 and a receiver may be a portion of the UE 10. On uplink, a transmitter may be a portion of the UE 10 and a receiver may be a portion of the BS 20.

Meanwhile, the wireless communication system may be broadly divided into an FDD (frequency division duplex) method and a TDD (time division duplex) method. According to the FDD method, uplink transmission and downlink transmission are performed while occupying different frequency bands. According to the TDD method, uplink transmission and downlink transmission are performed in different times while occupying the same frequency band. The channel response of the TDD method is substantially reciprocal. This means that the downlink channel response and the uplink channel response are almost the same in a given frequency domain. Accordingly, in a wireless communication system based on TDD, the downlink channel response may be obtained from the uplink channel response. In the TDD method, since uplink transmission and downlink transmission are time-divisionally performed in the entire frequency band, downlink transmission by a base station and uplink transmission by a UE cannot be simultaneously performed. In a TDD system in which uplink transmission and downlink transmission are divided in units of subframes, uplink transmission and downlink transmission are performed in different subframes.

Hereinafter, an LTE system will be described in greater detail.

Figure 2:
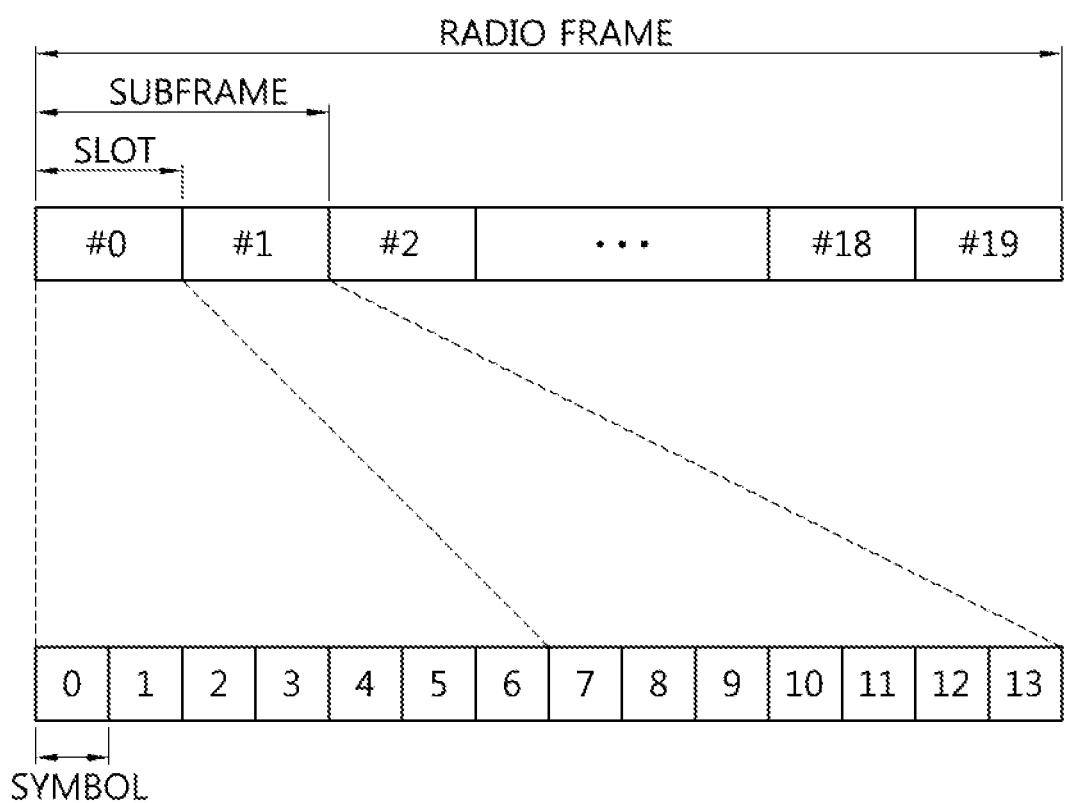
FIG. 2 is a view showing the structure of a radio frame according to frequency division duplex (FDD) in 3GPP LTE.

FIG. 2 is a view showing the structure of a radio frame according to FDD in 3GPP LTE.

Referring to FIG. 2, the radio frame includes 10 subframes and one subframe includes two slots. The slots in the radio frame are numbered from 0 to 19. A time required to transmit one subframe is referred to as a transmission time interval (TTI). The TTI may be a scheduling unit for data transmission. For example, the length of one radio frame may be 10 ms, the length of one subframe may be 1 ms, and the length of one slot may be 0.5 ms.

The structure of the radio frame is merely exemplary and the number of subframes included in the radio frame or the number of slots included in the subframe may be variously changed.

Meanwhile, one slot may include a plurality of orthogonal frequency division multiplexing (OFDM) symbols. The number of OFDM symbols included in one slot may vary according to cyclic prefix (CP).

One slot includes $N_{RB}$ resource blocks (RBs) in the frequency domain. For example, in an LTE system, the number of RBs, that is, $N_{RB}$, may be any one of 6 to 110.

The RB is a resource allocation unit and includes a plurality of subcarriers in one slot. For example, if one slot includes 7 OFDM symbols in the time domain and the RB includes 12 subcarriers in the frequency domain, one RB may include 7×12 resource elements (REs).

In 3GPP LTE, physical channels may be classified into a PDSCH (Physical Downlink Shared Channel) and a PUSCH (Physical Uplink Shared Channel) as data channels, and a PDCCH (Physical Downlink Control Channel), a PCFICH (Physical Control Format Indicator Channel), a PHICH (Physical Hybrid-ARQ Indicator Channel) and a PUCCH (Physical Uplink Control Channel) as control channels.

Uplink channels include a PUSCH, a PUCCH, an SRS (Sounding Reference Signal), and a PRACH (Physical Random Access Channel).

Figure 3:
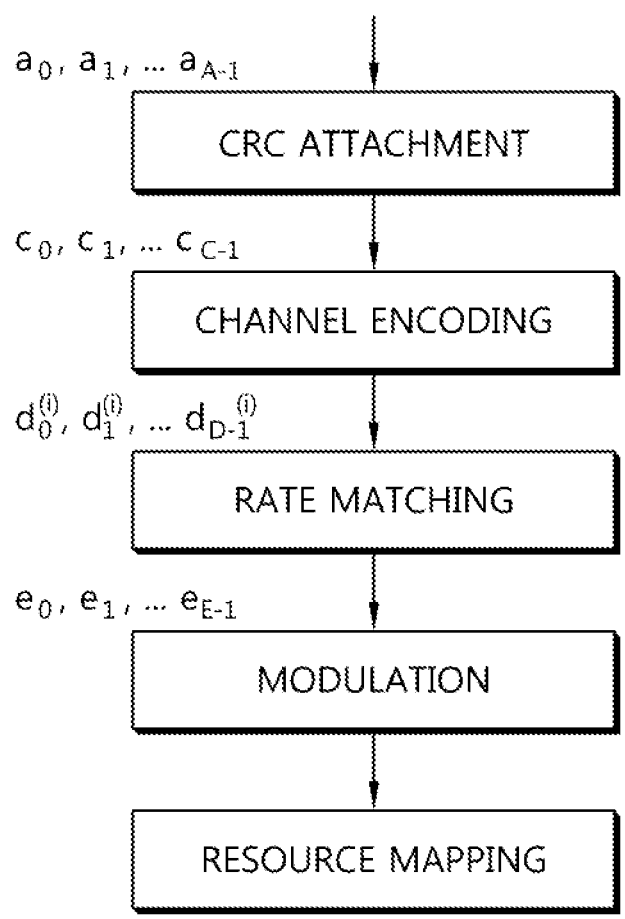
FIG. 3 is a view showing a processing procedure for data transmission.

FIG. 3 is a view showing a processing procedure for data transmission.

Data bits (that is, $a_0, a_1, \ldots, a_{A-1}$) are received from a MAC (Media Access Control) layer every TTI in the form of a transport block. The physical layer attaches CRC (Cyclic Redundancy Check) to the data bits (that is, $a_0, a_1, a_{A-1}$) to generate bits $c_0, c_1, \ldots, c_{C-1}$.

Subsequently, channel encoding is performed with respect to the generated bits. For example, as channel encoding, a TBCC (Tail-biting Convolutional Code) having ⅓ code rate may be used. The encoded sequences are denoted by $d^{(i)}_0, d^{(i)}_1, \ldots, d^{(i)}_{(D-1)}$. D denotes the number of encoded bits per output stream and i denotes the index of the encoder output bitstream. Subsequently, rate matching is performed with respect to the encoded sequences to output $e_0, e_1, \ldots, e_{A-1}$. After rate matching is performed, modulation is performed. The modulated symbols are mapped to physical resource elements (REs) and then are transmitted.

<Next-Generation Mobile Communication Network>

With success of LTE (long term evolution)/LTE-Advanced (LTE-A) for fourth-generation mobile communication, interest in next-generation mobile communication (fifth-generation mobile communication) is increasing and research into next-generation mobile communication (fifth-generation mobile communication) is ongoing.

Fifth-generation mobile communication defined by ITU (International Telecommunication Union) provides a data transmission rate of up to 20 Gbps and a sensible transmission rate of at least 100 Mbps everywhere. Fifth-generation mobile communication is officially named "IMT-2020" and aims at worldwide commercialization in 2020.

The ITU proposes three use scenarios, e.g., eMBB (enhanced Mobile BroadBand), mMTC (massive Machine Type Communication) and URLLC (Ultra-Reliable Low Latency Communication).

URLLC relates to a use scenario requiring high reliability and low latency. For example, services such as automatic driving, factory automation and augmented reality require high reliability and low latency (e.g., 1 ms or less). Currently, latency of 4G (LTE) is statistically 20 to 43 ms (best 10%) and 33 to 75 ms (median). This is insufficient to support a service requiring latency of 1 ms or less. Next, eMBB relates to a use scenario requiring mobile ultra-wideband.

In other words, as mobile communication based on the 4G LTE/international mobile telecommunications (IMT) standard has been successfully commercialized, research into next-generation mobile communication (fifth-generation mobile communication) is ongoing. The fifth-generation mobile communication system aims at higher capacity than 4G LTE and can increase the density of mobile broadband users and support device to device (D2D), high stability and machine type communication (MTC). Research into and development of the 5G mobile communication system aim at lower latency and lower battery consumption than the 4G mobile communication system in order to better implement the Internet of things. For such 5G mobile communication, new radio access technology (New RAT or NR) may be proposed.

In NR, reception from a base station may use downlink subframes and transmission to the base station may use uplink subframes. This scheme is applicable to paired spectra and unpaired spectra. A pair of spectra means that two carrier spectra are included for downlink and uplink operation. For example, in a pair of spectra, one carrier may include a pair of a downlink band and an uplink band.

Figure 4:
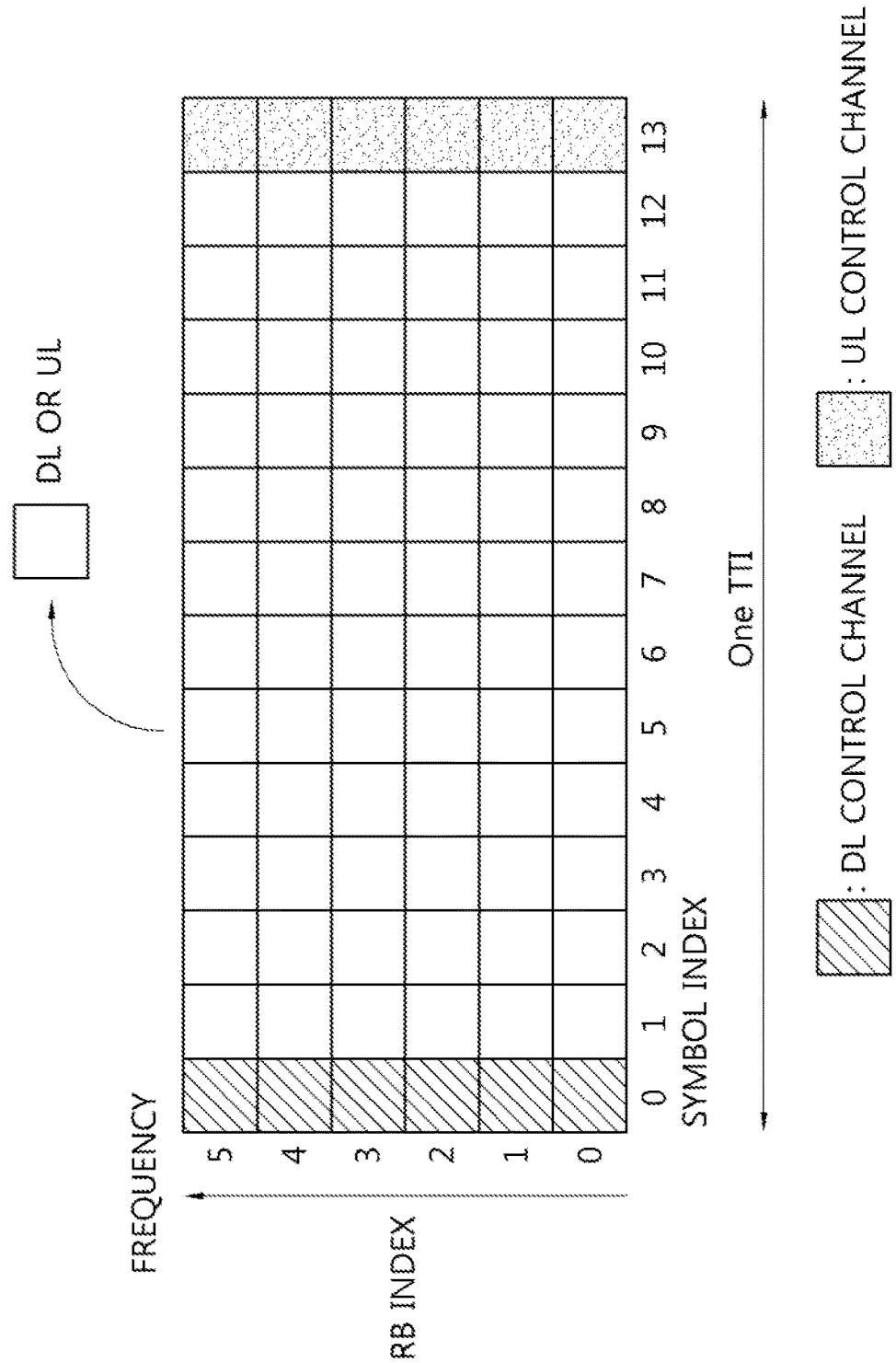
FIG. 4 is a view showing an example of a subframe type in new radio (NR).

FIG. 4 is a view showing an example of a subframe type in NR.

The transmission time interval (TTI) shown in FIG. 4 may be referred to as a subframe or slot for NR (or new RAT). The subframe (or the slot) of FIG. 9 may be used in an NR (or new RAT) TDD system in order to minimize data transmission delay. As shown in FIG. 3, the subframe (or the slot) includes 14 symbols, similarly to a current subframe. The front symbol of the subframe (or the slot) may be used for a DL control channel and the rear symbol of the subframe (or the slot) may be used for a UL control channel. The remaining symbols may be used for DL data transmission or UL data transmission. According to such a subframe (or slot) structure, downlink transmission and uplink transmission may be sequentially performed in one subframe (or slot). Accordingly, downlink data may be received in the subframe (or the slot) and uplink ACK/NACK may be transmitted in the subframe (or the slot). Such a subframe (or slot) structure may be referred to as a self-contained subframe (or slot). When such a subframe (or slot) structure is used, a time required to retransmit data which has been erroneously received can be reduced, thereby minimizing final data transmission latency. In the self-contained subframe (or slot) structure, a time gap may be necessary in a process of switching from a transmission mode to a reception mode or from a reception mode to a transmission mode. To this end, in the subframe structure, when switching from DL to UL, some OFDM symbols may be set as a guard period (GP).

Requirements of the 5G system include latency, peak data rate, error correction, etc. The 5G system, which will be used not only in a mobile communication system but also in ultra-high-resolution media streaming, the Internet of things, cloud computing, autonomous vehicles, etc., aims at performance much higher than the requirements of the LTE system in various areas.

The 5G system aims at 1 ms which is 1/10 the latency of the LTE system. Such short latency is an important indicator in an area directly related to human life, such as autonomous vehicles. The 5G system aims at a high transmission rate. The 5G system is expected to provide high-capacity high-speed communication such as high-quality media service streaming services with a maximum transmission rate which is 20 times that of the LTE system and a sensible transmission rate which is 10 to 100 times that of the LTE system. Error correction capability reduces a data retransmission rate, thereby improving latency and a data transfer rate.

As a 5G channel coding method, first, a turbo code, a polar code, a low density parity check (LDPC) code, etc. are considered.

First, the turbo code refers to a method of concatenating convolutional codes in parallel and applies different arrangements of the same sequence to two or more component codes. In the turbo code, a soft output iterative decoding method is used as a decoding method. Since the basic concept of turbo code decoding is to improve performance by exchanging information on each bit within a decoding period and using the information for next decoding, it is necessary to obtain soft output in the decoding process of the turbo code. Such a probabilistic iterative decoding method leads to excellent performance and speed.

Next, the LDPC code is based on the characteristics of an LDPC iterative decoding scheme, in which error correction capability per bit is improved but calculation complexity per bit is maintained, by increasing the length of the code. In addition, since the code may be designed such that decoding operation is performed in parallel, decoding of a long code can be performed at a high speed.

Finally, the polar code has low coding and low decoding complexity and is a first error correction code which has theoretically been proven to achieve a channel capacity in a general binary discrete memoryless symmetric channel. In contrast to the turbo code and the LDPC code using the iterative decoding process, the polar code uses a combination of successive cancelation (SC) decoding and list decoding. In addition, the polar code improves performance through pipelining, unlike the LDPC for improving performance through a parallel process.

Figure 5A:
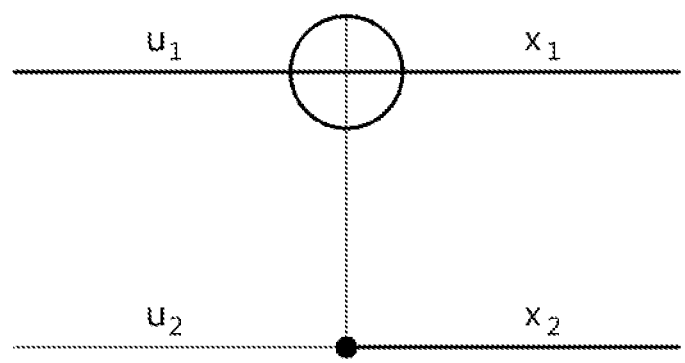
FIG. 5a is a view showing the basic concept of a polar code and FIG. 5b is a view showing the structure of a successive cancellation (SC) decoder.
Figure 5B:
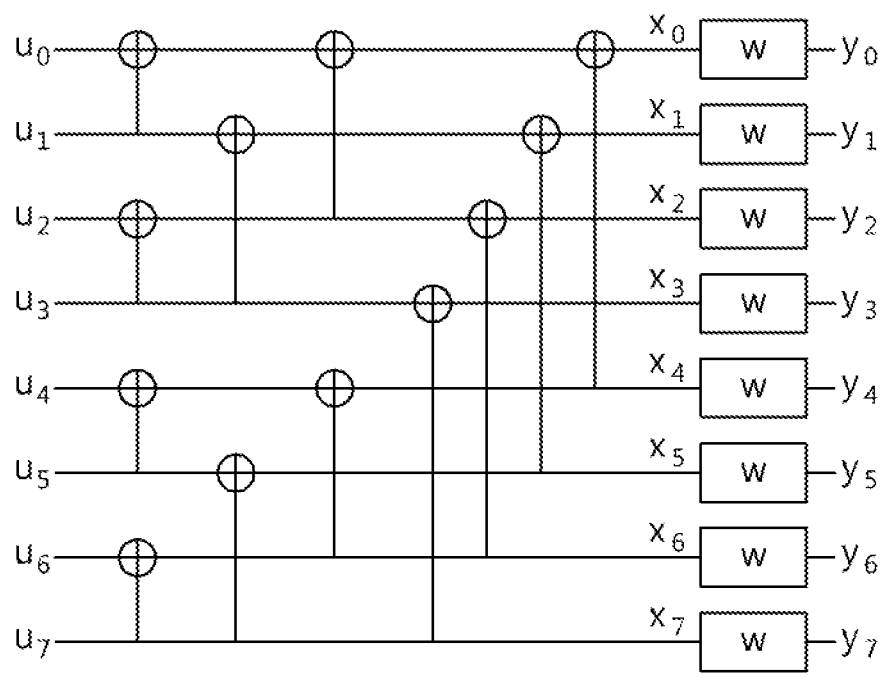

FIG. 5a is a view showing the basic concept of a polar code and FIG. 5b is a view showing the structure of an SC decoder.

Referring to FIG. 5a, different inputs $u_1$ and $u_2$ undergo different channels and thus x1 and x2 are output. At this time, assume that input $u_2$ passes through a relatively good channel and input $u_1$ passes through a relatively bad channel. The channel means influence of an encoder. If the structure of FIG. 4a is repeated, input $u_2$ passing through the good channel gradually becomes better and input $u_1$ passing through the bad channel gradually becomes worse, thereby obtaining the structure shown in FIG. 4b. This is referred to as polarization.

The structure shown in FIG. 5b may be generated by a Kronecker product of a 2×2 kernel matrix. Accordingly, an encoder is always generated in the form of the exponent of a natural number (e.g., 2 or 3).

In FIG. 5b, assume that the channel experienced by input $u_7$ is better than the channel experienced by input $u_0$. That is, assume that the larger the index, the better the channel.

The polar code means a method of mapping data to a good channel and mapping a frozen bit (that is, known bit information such as 0) to a bad channel, using polarization effects.

At this time, a code rate is determined by (the number of data bits)/(the number of data bits+the number of frozen bits).

DISCLOSURE OF THE INVENTION

As described above, utilizing the polar code in the next-generation mobile communication has been discussed. That is, utilizing the polar code in the channel encoding process shown in FIG. 3 has been discussed. However, there has been a problem that efficiency is reduced when the polar code is used.

Accordingly, an object of this disclosure is to propose methods of efficiently using the polar code in a channel encoding process. More specifically, this disclosure proposes a method of designing a channel coding chain necessary when an NR system uses a linear block code. Here, the range of the channel coding chain includes operations after generation of all information bits to be transmitted by a transmission side is finished (for example, including attachment of CRC) until rate matching is performed. Meanwhile, although the polar code is focused upon in this specification, the disclosure is applicable to other linear block codes available in the next-generation system in addition to the polar code.

I. First Disclosure: Channel Coding Chain Using Interleaving

The channel coding scheme according to the first disclosure of this specification may include an interleaving step. The channel coding scheme according to the first disclosure of this specification is applicable to uplink control information (UCI) transmitted through an uplink control channel (e.g., PUCCH) and UCI transmitted through an uplink data channel (e.g., PUSCH). In addition, the channel coding step according to the first disclosure of this specification is applicable to downlink control information (DCI) transmitted through a downlink control channel (e.g., PDCCH).

Figure 6:
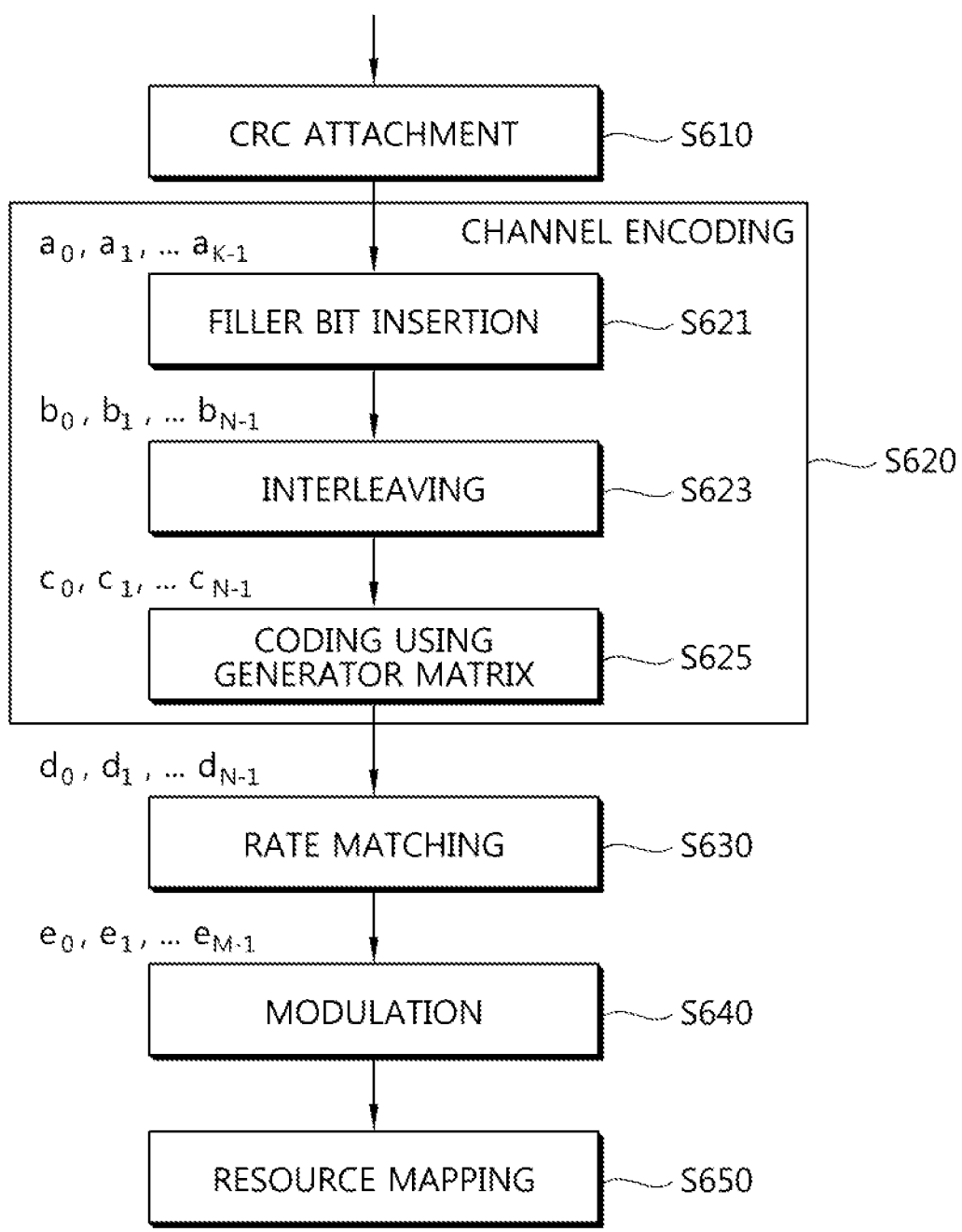
FIG. 6 is a flowchart illustrating a data transmission process according to this disclosure.

FIG. 6 is a flowchart illustrating a data transmission process according to disclosure of this specification.

When comparing FIG. 6 with FIG. 3, the channel coding step S620 according to the first disclosure may include a filler bit insertion step S621, an interleaving step S623, and a coding step S625 using a generator matrix.

In the CRC attachment step S610, when data bits are received from a MAC layer, a physical layer attaches CRC (Cyclic Redundancy Check) to the information bits to output K bits (that is, $a_0, a_1, \ldots, a_{K-1}$).

The information bits input to the channel coding step S620 according to the first disclosure are $a_0, a_1, \ldots, a_{K-1}$, and the size thereof may be K. Here, K means the size of the information bits output from the CRC attachment step S610. In the filter bit insertion step S621, N-k filler bits are added to the input information bits (that is, $a_0, a_1, \ldots, a_{K-1}$) having the size of K to output bits $b_0, b_1, \ldots, b_{N-1}$ having a size of N. The bits $b_0, b_1, \ldots, b_{N-1}$ having the size of N, which are output from the filler bit insertion step S621 are input to the interleaving step S623. The output bits of the interleaving step S623 are $c_0, c_1, \ldots, c_{N-1}$ having a size of N. The bits $c_0, c_1, \ldots, c_{N-1}$ having the size of N, which are output from the interleaving step S623, are input to the coding step S625 using the generator matrix. Here, N may be determined by R (=K'/N) representing a target code rate and K. For example, if the value of N is configured to be selected from a predefined set, that is, $S_N=\{N_0, N_1, \ldots, N_{max}\}$, a value closest to the value of K/R or the smallest value of values greater than K/R may be selected as the value of N. Alternatively, the value of N may be determined by the value of M. For example, if the value of N is configured to be selected from a predefined set, that is, $S_N=\{N_0, N_1, \ldots, N_{max}\}$, a value closest to the value of M or the smallest value of the values greater than M may be selected as the value of N.

Meanwhile, the filler bit insertion process S621 will be described in greater detail. The filler bits may be a bit string having a length of J formed by a predefined rule. A transmission side and a reception side may know the filler bits. In the case of J>N-K, N-K bits may be selected from the bit string and used as filler bits. In contrast, in the case of J<N-K, the bit string may be repeated to generate filler bits satisfying a size of N-K. Alternatively, in the case of J<N-K, N-K-J 0 bits may be added to the bit string having the size of J to generate the filler bits having a size of N-K. If the bit string for generating the filler bits is not separately specified, all the filler bits may be filled with 0. When the generated filler bits having the size of N-K are represented by [$j_0, j_1, \ldots, j_{N-K-1}$], the output bits after performing the filler bit insertion step S621 may be one of the following methods. A first method shown in Table 1 shows an example of generating output bits by first mapping input bits and then filling filler bits and a second method shown in table 2 shows an example of generating output bits by first filling filler bits and then mapping input bits.

TABLE 1

Set, i to 0
    while ( i<N-1 )
        if ( i < K )
            bi = ai
        else if ( i≧K )
            bi = ji-K
        end if
        i i+1
    end while

TABLE 2

```
Set, i to 0
    while ( i<N-1 )
        if( i<N-K )
            b_i = j_i
        else if ( i ≥≥ N-K )
            b_i = a_i
        end if
        i i+1
    end while
```

Next, the interleaving step S623 will be described in greater detail. The input signals having a size of N are reordered according to a predetermined pattern. The pattern used in the interleaving step S623 may be determined by N which is the size of the input bits. The pattern is used to order input bits in the order of high reliability of the input positions of the bits determined by the generator matrix (or in the order of sizes in the weighted sequence using indices). For example, the interleaving step S623 may sequentially order the input bits at channel positions having high reliability in ascending order of indices and then output the bits to the coding step S625. That is, the interleaving step S623 reorders the input bits $b_0, b_1, \ldots, b_{N-1}$ having a size of N in the order of good channel quality among unfrozen positions of the polar code and then outputs bits (that is, $c_0, c_1, \ldots, c_{N-1}$) having a size of N.

Here, if the sequence for determining the pattern of the interleaving step S623 with respect to a specific size of N is represented by $[w_{N,0}, w_{N,1}, \ldots, w_{N,N-1}]$, the output bits of the interleaving step S623 may be generated as shown in the following table.

TABLE 3

```
Set, i to 0
    while ( i<N-1 )
        j = w_{N,i}
        c_j = b_i
        i = i+1
    end while
```

Next, the coding step S625 using the generator matrix will be described in greater detail. In the coding step S625, linear combination is performed using a block code having a size of N×N. That is, in the coding step S625, linear combination operation is performed with respect to the input bits having a size of N to generate output bits having a size of N. Here, N basis sequences defined as $M_{i,n}$ are used, where i denotes an input bit index of the coding step S625 using the generator matrix and n denotes the output bit index of the coding step S625 using the generator matrix.

The coding step S625 uses a Kronecker product based on an m×m kernel matrix (m being an arbitrary natural number greater than 2). Here, when only one kernel matrix is used, a set of Ns, which are sizes available in the coding step S625, may be defined as $S_{m,N} = \{N_{m,i} = m^i | 0 \le i \le n_{max}\}$ with respect to the size m of the kernel matrix. Here, $n_{max}$ is an arbitrary natural number and means $n_{max} \log_m(N_{max})$ with respect to a maximum possible value $N_{max}$ of $S_{m,N}$.

If the coding step S625 is performed using a Kronecker product based on a 2×2 kernel matrix, the basis sequence may be generated using the following equation.

$$M_{0,0} = 1 \quad \text{Equation 1}$$

$$M_{i,j} = \begin{cases} 0, & j > i \\ 1, & j = 1 \\ M_{p,q}, & 1 < j \le i \end{cases}$$

where $p = i - 2^{\lfloor \log_2 i \rfloor}$, $q = j \bmod 2^{\lfloor \log_2 j \rfloor}$ The basis sequence generated through the above equation may be represented in the form of a table. This will be described with reference to FIG. 7.

Figure 7:
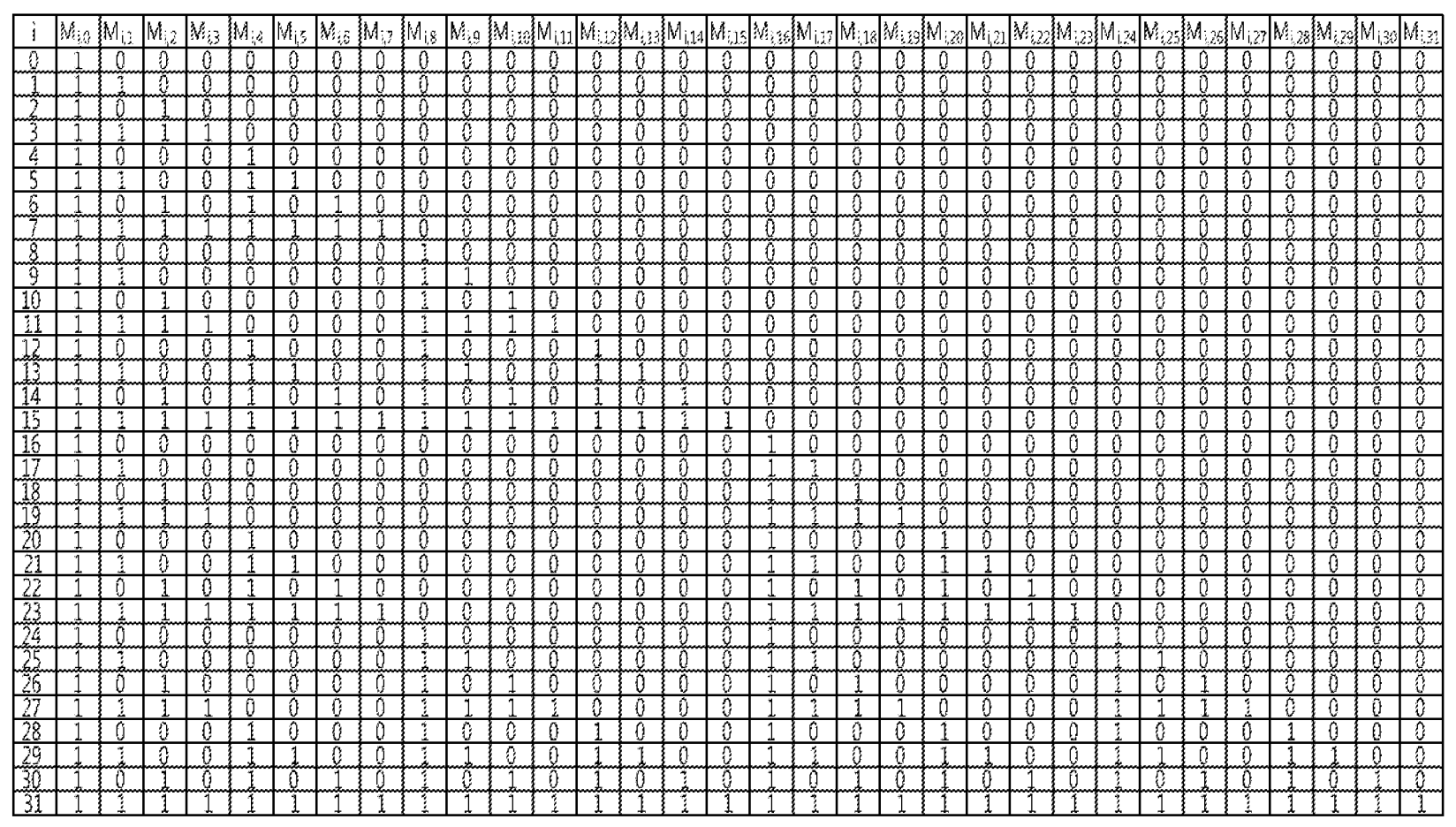

FIG. 7 is a table showing an example of basis sequences having a size of N=32.

Although the table of the basis sequences having the size of N=32 is shown for convenience in FIG. 7, a table having a larger size may be generated using the above equation. If the basis sequences having the size of N are represented in the form of a table, the coding step S625 may be performed based on the generator matrix having a size less than N using some of the basis sequences. For example, when the coding step S625 is performed using the generator matrix having a size of N=16, sequences of $M_{i,1}$ to $M_{i,15}$ may be selected from the table of FIG. 7 and indices of i=0 to 15 may be selected.

The output bits of the coding step S625 may be generated using the following equation.

$$d_n = \sum_{i=0}^{N} (c_i \cdot M_{i,n}) \bmod 2, \text{ where } n = 0, 1, \ldots, N-1 \quad \text{Equation 2}$$

II. Second Disclosure: Channel Coding Chain Using Permutation Matrix

The channel coding step according to a second disclosure of this specification may use a permutation matrix.

FIG. 8 is a flowchart illustrating a data transmission process according to disclosure of this specification.

When comparing FIG. 8 with FIG. 3, the channel coding step S820 of this specification may include a coding step S821 using a generator matrix.

The information bits input to the proposed channel coding step are $a_0, a_1, \ldots, a_{K-1}$, and the size thereof may be K. The size of the bits input to the coding step S821 using the generator matrix may be K. The size of the bits output from the coding step S821 using the generator matrix may be N. Here, K means the size of the information bits before performing the channel coding step S821. In addition, N may be determined by R (=K'/N) representing a target code rate and K. For example, if the value of N is configured to be selected from a predefined set, that is, $S_N = \{N_0, N_1, \ldots, N_{max}\}$, a value closest to the value of K/R or the smallest value of values greater than K/R may be selected as the value of N. Alternatively, the value of N may be determined by the value of M. For example, if the value of N is configured to be selected from a predefined set, that is, $S_N = \{N_0, N_1, \ldots, N_{max}\}$, a value closest to the value of M or the smallest value of the values greater than M may be selected as the value of N.

The coding step S821 using the generator matrix will be described. Linear combination operation is performed using a block code having a size of K×N. In the coding step S821 using the generator matrix, linear combination operation is performed with respect to the input bits having a size of K to generate output bits having a size of N. Here, N basis sequences defined as $G_{i,n}$ are used. Here, i denotes an input bit index of the coding step S821 using the generator matrix and n denotes the output bit index of the coding step S821 using the generator matrix.

The coding step S821 using the generator matrix may use a combination of a matrix M generated using a Kronecker product based on an m×m kernel matrix (m being an arbitrary natural number greater than 2) and a permutation matrix P. At this time, M may be obtained by N×N and P may be obtained by K×N. The matrix G used in the coding step S821 may be obtained using the matrices M and P as follows.

$$G = P \cdot M \quad \text{Equation 3}$$

At this time, when only one kernel matrix is used, a set of Ns which are sizes available in the coding step S821 using the generator matrix may be defined as $S_{m,N} = \{N_{m,i} = m^i | 0 \leq i \leq n_{max}\}$ with respect to the size m of the kernel matrix. Here, $n_{max}$ is an arbitrary natural number and means $n_{max} \log_m(N_{max})$ with respect to a maximum possible value $N_{max}$ of $S_{m,N}$.

If the coding step S821 is performed using a Kronecker product based on a 2×2 kernel matrix, the basis sequence may be generated using the following equation.

$$M_{0,0} = 1$$
$$M_{i,j} = \begin{cases} 0, & j > i \\ 1, & j = 1 \\ M_{p,q}, & 1 < j \leq i \end{cases} \quad \text{Equation 4}$$
$$\text{where } p = i - 2^{\lfloor \log_2 i \rfloor}, q = j \bmod 2^{\lfloor \log_2 j \rfloor}$$

The permutation matrix P may be designed for the purpose of shuffling the indices of each row of the matrix M using the Kronecker product and the purpose of generating the basis sequences to be used in the coding step S821 using the generator matrix. The permutation matrix P may be selected by the size K of the bits input to the coding step S821 using the generator matrix and the size N of the output bits. If a set of Ns, which are sizes of the output bits available in the coding step S821 using the generator matrix, is $S_N$, a matrix $P_T$ having a size of N×N determined with respect to all Ns in $S_N$ may be used. $P_T$ may be generated to have one 1 and the remaining values of 0 in each row and column. This may mean that, when the value of 1 in an i-th row of $P_T$ appears at the position of a j-th column, an i-th row of G is generated by a j-th row of M. The position of 1 in $P_T$ may use the order of higher reliability (or the order of sizes in the weighted sequences using row indices) from the viewpoint of the row index of the matrix M using the Kronecker product. For example, column indices are determined to sequentially have a value of 1 from an index having high reliability from the viewpoint of the row index of the matrix M in ascending order of row index of $P_T$. For example, $P_T$ having a size of 8×8 may be configured in the following form.

$$P_T = \begin{bmatrix} 0 & 0 & 0 & 0 & 0 & 0 & 0 & 1 \\ 0 & 0 & 0 & 0 & 0 & 0 & 1 & 0 \\ 0 & 0 & 0 & 1 & 0 & 0 & 0 & 0 \\ 0 & 0 & 0 & 0 & 0 & 1 & 0 & 0 \\ 0 & 0 & 1 & 0 & 0 & 0 & 0 & 0 \\ 0 & 0 & 0 & 0 & 1 & 0 & 0 & 0 \\ 0 & 1 & 0 & 0 & 0 & 0 & 0 & 0 \\ 1 & 0 & 0 & 0 & 0 & 0 & 0 & 0 \end{bmatrix} \quad \text{Equation 5}$$

In order to generate P using the $P_T$ selected by the size of N, K rows may be selected from $P_T$. Specifically, K rows may be selected from row index 0 of $P_T$ in ascending order.

The permutation matrix P may be represented in the form of a sequence indicating the index of the matrix M to be operated on the input bits in the coding step S821 using the generator matrix. For example, when represents the index of the matrix M to be selected by an i-th index of the coding step S821 using the generator matrix, a sequence vector $p_K$ having a length of K representing the permutation matrix may be defined as follows.

$$p_K = [p_0, p_1, \ldots, p_{K-1}] \quad \text{Equation 6}$$

The sequence vector $p_K$ may select and use K elements from the sequence vector $p_T$ representing all indices of $P_T$. For example, K elements may be selected from the row index 0 in ascending order.

Then, the output bits in the coding step S821 using the generator matrix may be generated as follows.

$$b_n = \sum_{i=0}^{K} (a_i \cdot M_{p_i, n}) \bmod 2, \quad \text{Equation 7}$$
$$\text{where } n = 0, 1, \ldots, N - 1$$

III. Third Disclosure: Interleaving Pattern or Permutation Matrix Pattern Design The method of designing the interleaving pattern of the first disclosure and the permutation matrix pattern of the second disclosure may be generally regarded as codeword pattern design for optimizing and selecting a codeword to be used by information bits. Accordingly, in the following description, for convenience, a codeword pattern is used as the term indicating the interleaving pattern and the permutation matrix pattern. The codeword pattern design condition of the third disclosure is proposed for the purpose of designing the interleaving pattern or the permutation matrix pattern but the third disclosure is generally applicable to the channel coding chain using the other linear block code.

The codeword pattern capable of obtaining optimal performance may vary according to the size of N. Accordingly, an available codeword pattern may be determined by the size of N. If the codeword pattern is given in the form of a table, the number of available Ns may be restricted due to a memory problem. In contrast, if the size M of the output bits of the rate matching step and the size N of the codeword pattern do not match, optimal performance cannot be guaranteed. Accordingly, the number of available Ns is determined such that performance deterioration does not occur in the range of M, to which puncturing and repetition are applied in the rate matching step.

In the proposed channel coding scheme, the value of N may be set to include a value satisfying $N = m^n$ with respect to an arbitrary integer n. At this time, m may be determined by the size of the kernel matrix used in the coding step using the generator matrix. For example, if the size of the kernel matrix is 2, N may include values represented in the form of the exponent of 2. If N is set using this method, the codeword pattern design may be determined through a density evolution method. At this time, density evolution may be performed based on the coding step using the generator matrix having a size of N×N. FIG. 9 shows a table of a codeword pattern with respect to N which is the exponent of 2.

Meanwhile, the value of N may be set to include values other than $N=m^n$. This serves to reduce performance deterioration due to excessive puncturing or repetition in the rate matching step. For example, there may be values of one or more Ns between $m^n$ and $m^{n+1}$ with respect to an arbitrary n value. If N is determined using this method, the codeword pattern may be determined using a density evolution method considering a puncturing pattern. At this time, density evolution considering the puncturing pattern may be performed based on the form in which $m^{n+1}-N$ columns are punctured in the coding step using the generator matrix having a size of $m^{n+1} \times m^{n+1}$ when N satisfies $m^n < N < m^{n+1}$. FIG. 10 is a table of codeword patterns when m=2 is considered and $N=(m^n+m^{n+1})/2$ is satisfied.

Meanwhile, if the values of available N are determined according to the above methods and the codeword pattern according to each N is determined, the value of N and the codeword pattern corresponding thereto may be determined by the size M of the output bits of the rate matching step. The smallest value of the values greater than M may be selected as the value of N. For example, if the set of available Ns is $S_N=\{16, 24, 32, 48, 64, 96, 128, 192, 256\}$, the value of N used in the case of M=80 may be 96. Alternatively, the range of M in which the value of each N may be selected may be fixed. For example, if the set of available Ns is $S_N=\{16, 24, 32, 48, 64, 96, 128, 192, 256\}$, the range of M which uses N=96 may be set to $80 < M \leq 112$.

In the structure of the proposed channel coding scheme, the value of N may be set to have a value satisfying N=mn with respect to an arbitrary integer n. In addition, there may be one or more codeword patterns corresponding to each N according to the range of M which is the size of the output bits of the rating matching step. In this case, the size of the bits input to the interleaving step may be set to satisfy mn. In addition, a criterion for selecting the size of N to be used and the codeword pattern may be determined by M. For example, if a kernel matrix having a value of m=2 is used, the set of available Ns may be set to $S_N=\{16, 32, 64, 128, 256\}$. Here, the size of N to be selected may be determined using a predefined relationship between M and N. For example, the value of N and the codeword table satisfying $M_{MIN} < M \leq M_{MAX}$ may be determined using the table shown in FIG. 11. In FIG. 11, the mode is a parameter indicating the index of the table to be used according to the value of M. For example, in the example of FIG. 11, if the sizes of the output bits of two different rate matching steps are M1=60 and M2=40, the interleaving size N=64 is shared but the modes of different codeword patterns are obtained. FIG. 12 shows tables of codeword patterns selectable according to mode determined according to a size of M in the case of N=64.

Meanwhile, there may be one or more codeword patterns corresponding to one N value. This is because the optimized forms of the codeword pattern may vary according to the decoding method even when the same N value is used. For example, the optimized forms of the codeword pattern optimized for a successive cancelation decoding method, a successive cancelation list decoding method and a maximum-likelihood (ML) decoding method may be different from each other. Alternatively, even when the same N value is used, the optimized codeword patterns may be different from each other when a target code rate or a target SNR value is different. For example, if the codeword pattern is designed using density evolution, a codeword pattern selected based on ⅓ code rate and a codeword pattern selected based on ⅙ code rate may be different from each other. In order to consider such a situation, there may be a plurality of optimized forms of the codeword pattern with respect to one N. For example, the codeword pattern may be designed with respect to the given N using two methods including the density evolution method considering the puncturing pattern and the method of maximizing a minimum distance considering the coding step using the generator matrix. As one example, the codeword pattern may be designed with respect to the given N in consideration of one or more target SNRs. FIG. 13 shows examples of codeword patterns available in the case of N=128.

If there are one or more codeword patterns with respect to a specific N value, one codeword pattern may be determined and used according to the conditions such as the decoding method, the target code rate and/or the target SNR.

If there are one or more codeword patterns with respect to a given N value, the base station (BS) may inform the UE of information indicating which codeword pattern is used through RRC signaling or system information. If information is not signaled through an RRC signal or system information, the UE may determine the codeword pattern using a specific method as a default. Similarly, the UE may determine the codeword pattern used to read (that is, decode) the RRC signal or system information based on a specific default value. Alternatively, the BS may inform the UE of the codeword pattern using DCI. In this case, a codeword pattern set as a default may be used with respect to a common search space for monitoring a PDCCH. Alternatively, if a 2-level DCI structure is used, the UE may use a codeword pattern set as a default with respect to first-level DCI and use a codeword pattern determined based on configuration information acquired through the first-level DCI with respect to second-level DCI. That is, the configuration information acquired through the first-level DCI may include information on the codeword pattern of the second-level DCI.

Meanwhile, the codeword pattern used by the UE may be limited. In this case, the UE may report performance/capability thereof to the BS. The report may be performed through a first message (that is, random access preamble) or a third message (that is, PUSCH) in the random access procedure (that is, RACH procedure). Here, the codeword pattern used to transmit the first message and the third message may be determined based on a predefined default value. In addition, a UE, which will use contention based transmission, may not perform reporting when resources necessary to report performance/capability thereof are insufficient and use a codeword pattern set as a default value.

The embodiments of the present invention can be implemented by a variety of means, for example, hardware, firmware, software, or a combination thereof. More specifically, the description will be made with reference to the drawings.

Figure 14:
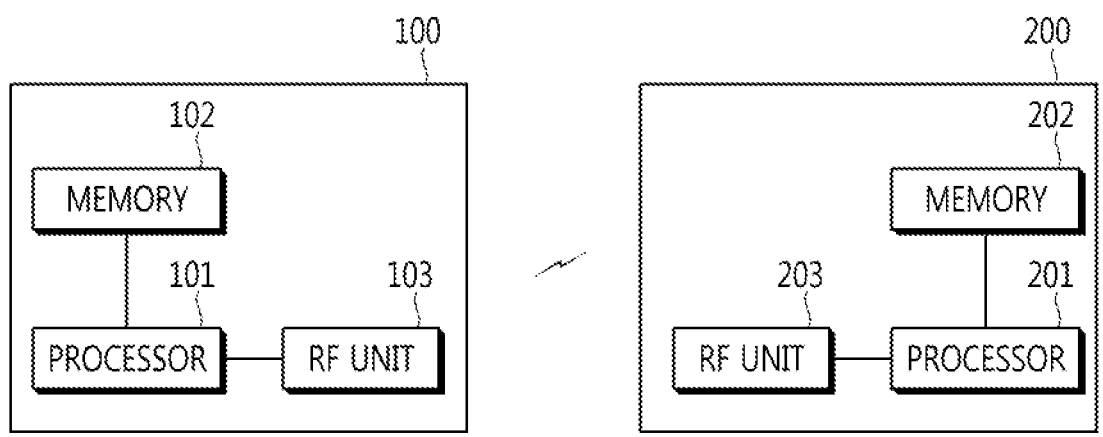
FIG. 14 is a block diagram showing a wireless communication system implemented by this disclosure.

FIG. 14 is a block diagram showing a wireless communication system implemented by this disclosure.

A base station 200 includes a processor 201, a memory 202 and a transceiver (or a radio frequency (RF) unit) 203. The memory 202 is connected to the processor 201 to store a variety of information for driving the processor 201. The transceiver (or the RF unit) 203 is connected to the processor 201 to transmit and/or receive a radio signal. The processor 201 implements the proposed function, process and/or method. In the above-described embodiment, operation of the base station may be implemented by the processor 201.

A radio apparatus (e.g., NB-IoT apparatus) 100 includes a processor 101, a memory 102 and a transceiver (or an RF unit) 103. The memory 102 is connected to the processor 101 to store a variety of information for driving the processor 101. The transceiver (or the RF unit) 103 is connected to the processor 101 to transmit and/or receive a radio signal. The processor 101 implements the proposed function, process and/or method.

The processor may include an application-specific integrated circuit (ASIC), another chipset, a logic circuit and/or a data processor. The memory may include a read-only memory (ROM), a random access memory (RAM), a flash memory, a memory card, a storage medium and/or another storage device. The RF unit may include a baseband circuit for processing the radio signal. When the embodiment is implemented in software, the above-described scheme may be implemented by a module (process, function, etc.) for performing the above-described function. The module may be stored in the memory and executed by the processor. The memory may be located inside or outside the processor and may be connected to the processor by various well-known means.

In the exemplary system described above, although the methods are described on the basis of a flowchart as a series of steps or blocks, the present invention is not limited to the order of steps, and some steps may be performed in order different from the order of the steps described above or at the same time. It will also be appreciated by those skilled in the art that the steps shown in the flowchart are not exclusive and that other steps may be included or that one or more steps in the flowchart may be eliminated without affecting the scope of the invention.

The invention claimed is:

1. A method of performing channel encoding, the method comprising:
    inserting N−K filler bits into information bits $a_0$, $a_1, \ldots$, and outputting filler bit inserted information bits $b_0, b_1, \ldots, b_{N-1}$, where K is a positive integer not greater than N,
    interleaving the filler bit inserted information bits $b_0$, $b_1, \ldots, b_{N-1}$ according to an interleaving pattern ($w_{N,0}$, $w_{N,1}, w_{N,N-1}$) of size N, and outputting interleaved information bits $c_0, c_1, \ldots, c_{N-1}$, where $c_j = b_j$ and $j = w_{N,i}$; and
    encoding the interleaved information bits $c_0, c_1, \ldots, c_{N-1}$ based on a polar code of size N, and outputting encoded information bits $d_0, d_1, \ldots, d_{N-1}$,
    wherein $N=2^n$, where n is a positive integer, and
    wherein, for N=256, the interleaving pattern ($w_0$, $w_1, \ldots, w_{N-1}$) is defined by:

| i | $w_{256,i}$ | i | $w_{256,i}$ | i | $w_{256,i}$ | i | $w_{256,i}$ |
|---|---|---|---|---|---|---|---|
| 0 | 255 | 32 | 126 | 64 | 179 | 96 | 198 |
| 1 | 254 | 33 | 241 | 65 | 122 | 97 | 172 |
| 2 | 253 | 34 | 234 | 66 | 199 | 98 | 93 |
| 3 | 251 | 35 | 125 | 67 | 173 | 99 | 177 |
| 4 | 247 | 36 | 220 | 68 | 228 | 100 | 120 |
| 5 | 239 | 37 | 233 | 69 | 121 | 101 | 103 |
| 6 | 223 | 38 | 175 | 70 | 216 | 102 | 197 |
| 7 | 252 | 39 | 230 | 71 | 118 | 103 | 170 |
| 8 | 250 | 40 | 123 | 72 | 171 | 104 | 62 |
| 9 | 191 | 41 | 218 | 73 | 226 | 105 | 116 |
| 10 | 249 | 42 | 229 | 74 | 158 | 106 | 143 |
| 11 | 246 | 43 | 217 | 75 | 63 | 107 | 91 |
| 12 | 245 | 44 | 119 | 76 | 117 | 108 | 224 |
| 13 | 238 | 45 | 214 | 77 | 212 | 109 | 156 |
| 14 | 243 | 46 | 188 | 78 | 225 | 110 | 169 |
| 15 | 238 | 47 | 227 | 79 | 157 | 111 | 195 |
| 16 | 127 | 48 | 159 | 80 | 110 | 112 | 61 |
| 17 | 222 | 49 | 213 | 81 | 115 | 113 | 114 |
| 18 | 235 | 50 | 186 | 82 | 210 | 114 | 166 |
| 19 | 221 | 51 | 206 | 83 | 167 | 115 | 87 |
| 20 | 231 | 52 | 111 | 84 | 184 | 116 | 108 |
| 21 | 219 | 53 | 211 | 85 | 204 | 117 | 154 |
| 22 | 190 | 54 | 185 | 86 | 109 | 118 | 208 |
| 23 | 248 | 55 | 182 | 87 | 155 | 119 | 113 |
| 24 | 215 | 56 | 205 | 88 | 209 | 120 | 59 |
| 25 | 189 | 57 | 240 | 89 | 180 | 121 | 165 |
| 26 | 244 | 58 | 181 | 90 | 202 | 122 | 79 |
| 27 | 187 | 59 | 124 | 91 | 94 | 123 | 106 |
| 28 | 207 | 60 | 203 | 92 | 107 | 124 | 153 |
| 29 | 242 | 61 | 232 | 93 | 178 | 125 | 200 |
| 30 | 236 | 62 | 95 | 94 | 201 | 126 | 150 |
| 31 | 183 | 63 | 174 | 95 | 151 | 127 | 163 |

| i | $w_{256,i}$ | i | $w_{256,i}$ | i | $w_{256,i}$ | i | $w_{256,i}$ |
|---|---|---|---|---|---|---|---|
| 128 | 55 | 160 | 71 | 192 | 133 | 224 | 160 |
| 129 | 92 | 161 | 23 | 193 | 88 | 225 | 52 |
| 130 | 105 | 162 | 39 | 194 | 81 | 226 | 26 |
| 131 | 176 | 163 | 7 | 195 | 69 | 227 | 42 |
| 132 | 31 | 164 | 77 | 196 | 21 | 228 | 28 |
| 133 | 47 | 165 | 162 | 197 | 37 | 229 | 44 |
| 134 | 102 | 166 | 54 | 198 | 5 | 230 | 10 |
| 135 | 149 | 167 | 75 | 199 | 73 | 231 | 130 |
| 136 | 196 | 168 | 104 | 200 | 49 | 232 | 66 |
| 137 | 142 | 169 | 51 | 201 | 25 | 233 | 18 |
| 138 | 90 | 170 | 161 | 202 | 41 | 234 | 34 |
| 139 | 101 | 171 | 53 | 203 | 9 | 235 | 2 |
| 140 | 147 | 172 | 30 | 204 | 129 | 236 | 144 |
| 141 | 168 | 173 | 27 | 205 | 65 | 237 | 96 |
| 142 | 194 | 174 | 46 | 206 | 17 | 238 | 136 |
| 143 | 141 | 175 | 43 | 207 | 33 | 239 | 12 |
| 144 | 60 | 176 | 148 | 208 | 1 | 240 | 132 |
| 145 | 89 | 177 | 29 | 209 | 98 | 241 | 80 |
| 146 | 99 | 178 | 45 | 210 | 138 | 242 | 68 |
| 147 | 86 | 179 | 11 | 211 | 192 | 243 | 20 |
| 148 | 139 | 180 | 131 | 212 | 14 | 244 | 36 |
| 149 | 193 | 181 | 67 | 213 | 134 | 245 | 4 |
| 150 | 15 | 182 | 19 | 214 | 84 | 246 | 72 |
| 151 | 135 | 183 | 35 | 215 | 82 | 247 | 48 |
| 152 | 112 | 184 | 3 | 216 | 56 | 248 | 24 |
| 153 | 58 | 185 | 145 | 217 | 70 | 249 | 40 |
| 154 | 164 | 186 | 100 | 218 | 22 | 250 | 8 |
| 155 | 85 | 187 | 146 | 219 | 38 | 251 | 128 |
| 156 | 78 | 188 | 97 | 220 | 6 | 252 | 0 |
| 157 | 83 | 189 | 137 | 221 | 76 | 253 | 16 |
| 158 | 152 | 190 | 13 | 222 | 74 | 254 | 32 |
| 159 | 57 | 191 | 140 | 223 | 50 | 255 | 64. |

2. The method according to claim 1, wherein the information bits $a_0, a_1, \ldots, a_{K-1}$ include uplink control information (UCI) of a physical uplink control channel (PUCCH).

3. The method according to claim 1, wherein the information bits $a_0, a_1, \ldots, a_{k-1}$ include uplink control information (UCI) of a physical uplink shared channel (PUSCH).

4. The method according to claim 1, wherein the information bits $a_0, a_1, \ldots, a_{k-1}$ include downlink control information (DCI) of a downlink control channel or data of a downlink data channel.

5. A user equipment (UE) configured to perform for performing channel encoding, the UE comprising:
    a transceiver;
    a processor;
    a memory storing at least one program that causes the processor to perform operations comprising:

inserting N-K filler bits into information bits $a_0, a_1, \ldots, a_{k-1}$ and outputting filler bit inserted information bits $b_0, b_{N-1}$ where K is a positive integer not greater than N;

interleaving the filler bit inserted information bits $b_0, b_1, \ldots, b_{N-1}$ according to an interleaving pattern $(w_{N,0}, w_{N,1}, \ldots, w_{N,N-1})$ of size N, and outputting interleaved information bits $c_0, c_1, \ldots, c_{N-1}$, where $c_j = b_j$ and $j = w_{N,i}$; and encoding the interleaved information bits $c_0, c_1, \ldots, c_{N-1}$ based on a polar code of size N, and outputting encoded information bits $d_0, d_1, \ldots, d_{N-1}$, wherein $N = 2^n$, where n is a positive integer, and wherein, for $N = 256$, the interleaving pattern $(w_{N,0}, w_{N,1}, \ldots, w_{N,N-1})$ is defined by:

| i | $w_{256,i}$ | i | $w_{256,i}$ | i | $w_{256,i}$ | i | $w_{256,i}$ | i | $w_{256,i}$ | i | $w_{256,i}$ | i | $w_{256,i}$ | i | $w_{256,i}$ |
|---|---|---|---|---|---|---|---|---|---|---|---|---|---|---|---|
| 0 | 255 | 32 | 126 | 64 | 179 | 96 | 198 | 128 | 55 | 160 | 71 | 192 | 133 | 224 | 160 |
| 1 | 254 | 33 | 241 | 65 | 122 | 97 | 172 | 129 | 92 | 161 | 23 | 193 | 88 | 225 | 52 |
| 2 | 253 | 34 | 234 | 66 | 199 | 98 | 93 | 130 | 105 | 162 | 39 | 194 | 81 | 226 | 26 |
| 3 | 251 | 35 | 125 | 67 | 173 | 99 | 177 | 131 | 176 | 163 | 7 | 195 | 69 | 227 | 42 |
| 4 | 247 | 36 | 220 | 68 | 228 | 100 | 120 | 132 | 31 | 164 | 77 | 196 | 21 | 228 | 28 |
| 5 | 239 | 37 | 233 | 69 | 121 | 101 | 103 | 133 | 47 | 165 | 162 | 197 | 37 | 229 | 44 |
| 6 | 223 | 38 | 175 | 70 | 216 | 102 | 197 | 134 | 102 | 166 | 54 | 198 | 5 | 230 | 10 |
| 7 | 252 | 39 | 230 | 71 | 118 | 103 | 170 | 135 | 149 | 167 | 75 | 199 | 73 | 231 | 130 |
| 8 | 250 | 40 | 123 | 72 | 171 | 104 | 62 | 136 | 196 | 168 | 104 | 200 | 49 | 232 | 66 |
| 9 | 191 | 41 | 218 | 73 | 226 | 105 | 116 | 137 | 142 | 169 | 51 | 201 | 25 | 233 | 18 |
| 10 | 249 | 42 | 229 | 74 | 158 | 106 | 143 | 138 | 90 | 170 | 161 | 202 | 41 | 234 | 34 |
| 11 | 246 | 43 | 217 | 75 | 63 | 107 | 91 | 139 | 101 | 171 | 53 | 203 | 9 | 235 | 2 |
| 12 | 245 | 44 | 119 | 76 | 117 | 108 | 224 | 140 | 147 | 172 | 30 | 204 | 129 | 236 | 144 |
| 13 | 238 | 45 | 214 | 77 | 212 | 109 | 156 | 141 | 168 | 173 | 27 | 205 | 65 | 237 | 96 |
| 14 | 243 | 46 | 188 | 78 | 225 | 110 | 169 | 142 | 194 | 174 | 46 | 206 | 17 | 238 | 136 |
| 15 | 238 | 47 | 227 | 79 | 157 | 111 | 195 | 143 | 141 | 175 | 43 | 207 | 33 | 239 | 12 |
| 16 | 127 | 48 | 159 | 80 | 110 | 112 | 61 | 144 | 60 | 176 | 148 | 208 | 1 | 240 | 132 |
| 17 | 222 | 49 | 213 | 81 | 115 | 113 | 114 | 145 | 89 | 177 | 29 | 209 | 98 | 241 | 80 |
| 18 | 235 | 50 | 186 | 82 | 210 | 114 | 166 | 146 | 99 | 178 | 45 | 210 | 138 | 242 | 68 |
| 19 | 221 | 51 | 206 | 83 | 167 | 115 | 87 | 147 | 86 | 179 | 11 | 211 | 192 | 243 | 20 |
| 20 | 231 | 52 | 111 | 84 | 184 | 116 | 108 | 148 | 139 | 180 | 131 | 212 | 14 | 244 | 36 |
| 21 | 219 | 53 | 211 | 85 | 204 | 117 | 154 | 149 | 193 | 181 | 67 | 213 | 134 | 245 | 4 |
| 22 | 190 | 54 | 185 | 86 | 109 | 118 | 208 | 150 | 15 | 182 | 19 | 214 | 84 | 246 | 72 |
| 23 | 248 | 55 | 182 | 87 | 155 | 119 | 113 | 151 | 135 | 183 | 35 | 215 | 82 | 247 | 48 |
| 24 | 215 | 56 | 205 | 88 | 209 | 120 | 59 | 152 | 112 | 184 | 3 | 216 | 56 | 248 | 24 |
| 25 | 189 | 57 | 240 | 89 | 180 | 121 | 165 | 153 | 58 | 185 | 145 | 217 | 70 | 249 | 40 |
| 26 | 244 | 58 | 181 | 90 | 202 | 122 | 79 | 154 | 164 | 186 | 100 | 218 | 22 | 250 | 8 |
| 27 | 187 | 59 | 124 | 91 | 94 | 123 | 106 | 155 | 85 | 187 | 146 | 219 | 38 | 251 | 128 |
| 28 | 207 | 60 | 203 | 92 | 107 | 124 | 153 | 156 | 78 | 188 | 97 | 220 | 6 | 252 | 0 |
| 29 | 242 | 61 | 232 | 93 | 178 | 125 | 200 | 157 | 83 | 189 | 137 | 221 | 76 | 253 | 16 |
| 30 | 236 | 62 | 95 | 94 | 201 | 126 | 150 | 158 | 152 | 190 | 13 | 222 | 74 | 254 | 32 |
| 31 | 183 | 63 | 174 | 95 | 151 | 127 | 163 | 159 | 57 | 191 | 140 | 223 | 50 | 255 | 64. |

6. The UE according to claim 5, wherein the information bits $a_0, a_1, \ldots, a_{K-1}$ include uplink control information (UCI) of a physical uplink control channel (PUCCH).

7. The UE according to claim 5, wherein the information bits $a_0, a_1, \ldots, a_{K-1}$ include uplink control information (UCI) of a physical uplink shared channel (PUSCH).

* * * * *